(12) United States Patent
Tomiyama et al.

(10) Patent No.: US 7,070,670 B2
(45) Date of Patent: Jul. 4, 2006

(54) ADHESIVE COMPOSITION, METHOD FOR PREPARING THE SAME, ADHESIVE FILM USING THE SAME, SUBSTRATE FOR CARRYING SEMICONDUCTOR AND SEMICONDUCTOR DEVICE

(75) Inventors: Takeo Tomiyama, Tsukuba (JP); Teiichi Inada, Tsukuba (JP); Masaaki Yasuda, Tsukuba (JP); Keiichi Hatakeyama, Tsukuba (JP); Yuuji Hasegawa, Tsukuba (JP); Masaya Nishiyama, Tsukuba (JP); Takayuki Matsuzaki, Ichihara (JP); Michio Uruno, Chiba (JP); Masao Suzuki, Tsukuba (JP); Tetsurou Iwakura, Tsukuba (JP); Yasushi Shimada, Tsukuba (JP); Yuuko Tanaka, Shimotsuma (JP); Hiroyuki Kuriya, Shimodate (JP); Keiji Sumiya, Hitachinaka (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 49 days.

(21) Appl. No.: 10/240,265

(22) PCT Filed: Mar. 30, 2001

(86) PCT No.: PCT/JP01/02716

§ 371 (c)(1),
(2), (4) Date: Feb. 21, 2003

(87) PCT Pub. No.: WO01/74962

PCT Pub. Date: Oct. 11, 2001

(65) Prior Publication Data

US 2003/0159773 A1  Aug. 28, 2003

(30) Foreign Application Priority Data

| Mar. 31, 2000 | (JP) | ............................ 2000-101253 |
| Mar. 31, 2000 | (JP) | ............................ 2000-101254 |
| Mar. 15, 2001 | (JP) | ............................ 2001-074268 |
| Mar. 19, 2001 | (JP) | ............................ 2001-078587 |

(51) Int. Cl.
*B32B 37/00* (2006.01)

(52) U.S. Cl. ...................... 156/248; 156/250; 156/330; 428/98; 438/460

(58) Field of Classification Search ................ 156/250, 156/325, 326, 327, 330, 335, 247, 248; 428/98, 428/460
See application file for complete search history.

(56) References Cited

U.S. PATENT DOCUMENTS

| 4,961,804 | A * | 10/1990 | Aurichio ...................... 156/248 |
| 6,478,918 | B1 * | 11/2002 | Bennett et al. .............. 156/248 |
| 6,689,245 | B1 * | 2/2004 | Tsujimoto .................... 156/267 |
| 6,773,536 | B1 * | 8/2004 | Lee .............................. 156/248 |

FOREIGN PATENT DOCUMENTS

| EP | 0 819 747 A1 | 1/1998 |
| JP | 61-235150 | 10/1986 |
| JP | 3-181580 | 8/1991 |
| JP | 9-298369 | 11/1997 |
| JP | 11-209724 | 8/1999 |
| JP | 11-260838 | 9/1999 |

* cited by examiner

*Primary Examiner*—James Sells
(74) *Attorney, Agent, or Firm*—Antonelli, Terry, Stout and Kraus, LLP.

(57) ABSTRACT

There are disclosed an adhesive composition comprising: (a) an epoxy resin, (b) a curing agent and (c) a polymer compound with a weight average molecular weight of 100,000 or more, wherein a ratio of A/B exceeds 1 and is 10 or less, where A represents the total weight of (a) the epoxy resin and (b) the curing agent and B represents a weight of (c) the polymer compound; an adhesive composition, whose compositions are separated into a sea phase and an island phase, when viewed at a section in a cured state, and a ratio X/Y is in a range of 0.1 to 1.0, where X is an area of the sea phase and Y is an area of the island phase; a process for producing said adhesive composition; an adhesive film wherein said adhesive composition is formed into a film form; an adhesive film for bonding a semiconductor chip and a wiring board for mounting a semiconductor or for bonding semiconductor chips themselves, wherein the adhesive film can perform bonding by heat-pressing with a pressure of 0.01 to 0.5 MPa; a wiring board for mounting a semiconductor equipped with said adhesive film on a surface for mounting a semiconductor chip; and a semiconductor device using said adhesive film or said wiring board for mounting a semiconductor.

42 Claims, 3 Drawing Sheets

(a)

(b)

ADHESIVE COMPOSITION, METHOD FOR PREPARING THE SAME, ADHESIVE FILM USING THE SAME, SUBSTRATE FOR CARRYING SEMICONDUCTOR AND SEMICONDUCTOR DEVICE

TECHNICAL FIELD

This invention relates to an adhesive composition, a process for producing the same, an adhesive film using the same, a substrate for mounting a semiconductor and a semiconductor device. More specifically, this invention relates to an adhesive composition which has heat resistance and moisture resistance required for mounting semiconductor chips on a substrate for mounting a semiconductor with largely different coefficients of thermal expansion, and further has an excellent oozing-resistance and circuit-filling property, as well as good storing property; a process for producing the same; an adhesive film using the same; and further, an adhesive film that can sufficiently perform bonding with a small enough pressure not to break a chip upon pressing; a substrate for mounting a semiconductor and a semiconductor device.

BACKGROUND ART

In recent years, a mounting density of electronic parts has been increased in accordance with the progress of electronic apparatuses, and new types of the mounting method are being employed, such as a method of mounting a semiconductor package having almost the same size as that of a semiconductor chip, called chip scale package or chip size package (hereinafter, simply referred to as "CSP"), or mounting a bare chip, etc.

One of the most important characteristics for a mounted board having mounted thereon various electronic parts including a semiconductor element is interconnection reliability. Among them, interconnection reliability against thermal fatigue is directly responsible for a reliability of an apparatus using a mounted board and is therefore a very important issue.

One of the causes of lowering the interconnection reliability is a thermal stress caused by using various materials with different coefficients of thermal expansion. Since a semiconductor element has a coefficient of thermal expansion as small as about 4 ppm/° C., whereas a wiring board on which electronic parts are mounted has a coefficient of thermal expansion as large as 15 ppm/° C. or more, a thermal strain is caused upon a thermal impact, which in turn generates a thermal stress.

A substrate having mounted thereon a semiconductor package having a lead frame such as QFP and SOP, etc. has maintained its reliability by absorbing a thermal stress at a portion of the lead frame.

However, in the bare chip mounting, there is employed a method of connecting an electrode of a semiconductor chip to a wiring board pad of a wiring board using a solder ball, or a method of connecting by preparing a small projection called bump and using a conductive paste. Therefore, a thermal stress is concentrated on this connecting portion, thereby lowering the interconnection reliability. It has been known that introducing an underfill resin between the semiconductor element and the wiring board is effective for dispersing the thermal stress. However, the number of steps for mounting is increased, thereby elevating the cost. On the other hand, there is a method of connecting an electrode of a semiconductor element to a wiring pad of a wiring board using conventional wire bonding, however, in this method, the board must be coated with a resin for encapsulation for protecting the wire, thus increasing the number of steps for mounting.

CSP can be mounted together with other electronic parts, and various structures have been proposed as shown in Table 1 appearing at page 5 of "Future of CSP (fine pitch BGA) put into practical use", the article of Surface Mounting Technology, March, 1997, published by Nikkan Kogyo Shimbun Ltd. Especially, a system in which a tape and a carrier substrate are used with a wiring board called interposer is being put into practical use. This includes systems shown in the above table that Tessera, Inc. and Texas Instruments Inc. are developing. In these systems, a semiconductor device is mounted through a wiring board called interposer, and hence excellent interconnection reliability is exhibited as reported in Shingaku Technical Report CPM96-121, ICD96-160 (1996-12) "Development of Tape BGA size CSP", and Sharp Technical Journal, No. 66 (1996-12) "Development of Chip Size Package".

Between the semiconductor chip of CSP and the wiring board called interposer, an adhesive film is preferably used which lowers the thermal stress caused by the difference in coefficients of thermal expansion between the semiconductor device and the wiring board. Accordingly, the adhesive film is required to have moisture resistance and durability at high temperatures. Further, from the viewpoint of facilitating control of the production process, the adhesive film is desired to be of a film type.

For these adhesive film, in addition to an effect for alleviating thermal stress, heat resistance and moisture resistance, it is required that adhesive should not be oozed out to an electrode portion equipped on a semiconductor chip to output an electric signal, for manufacturing process. In addition, in case of using a wiring board with through-hole, it is requisite that an adhesive should not be oozed out from the through-holes. This is because oozing of the adhesive causes failure in connection of the electrodes, and oozing of the adhesive from the through-holes spoils a metal mold, causing a failure in connection. In addition, since a void between a circuit and an adhesive tends to lower heat resistance and moisture resistance, there should not be a void left between the circuit on a wiring board and the adhesive.

An adhesive of a film type is used in flexible printed circuit boards, and those comprised mainly of an acrylonitrile-butadiene rubber are frequently used.

As printed circuit board materials with an improved moisture resistance, Japanese Provisional Patent Publication No. 243180/1985 discloses an adhesive comprising an acrylic resin, an epoxy resin, polyisocyanate and an inorganic filler, and Japanese Provisional Patent Publication No. 138680/1986 discloses an adhesive comprising an acrylic resin, an epoxy resin, a compound having a urethane bond in the molecule and having primary amine at both terminals thereof and an inorganic filler.

However, these adhesives have disadvantages in that the adhesive force is significantly lowered after being treated at a high temperature for a long time and that a resistance to electrolytic corrosion is insufficient. The adhesives suffer significant deterioration especially in the moisture resistance test under severe conditions in, e.g., a pressure cooker test (PCT) treatment, which is used for the reliability evaluation of semiconductor relating parts.

When the semiconductor chip is mounted on a wiring board, using the adhesive as a printed circuit board relating material, the adhesive film cannot be used since the difference in coefficients of thermal expansion between the semiconductor chip and the interposer is large, thereby easily generating a crack during reflow. In addition, the adhesive film cannot be used, since it suffers significant deterioration when it is subjected to moisture resistance test under severe conditions, e.g., in the temperature cycle test or PCT treatment.

On the other hand, as an adhesive whose adhesiveness is less deteriorated even after being treated at a high temperature for a long period of time, there has been disclosed an adhesive obtained by mixing a reactive acrylic rubber or an acrylonitrile-butadine rubber with an epoxy resin. As for the reactive rubber type adhesive, there is disclosed an adhesive composition comprising an acrylic elastomer containing carboxyl groups and hydroxyl groups or epoxy groups, an alkyl phenol, an epoxy resin and imidazolium trimellitate, as disclosed in Japanese Provisional Patent Publication No. Hei 3-181580, and this is used in a field where a copper film is bonded on a support film of a flexible printed wiring board.

The present inventors have found that, as described in Japanese Provisional Patent Publication No. 2000-154361, by reducing the elastic modulus of the adhesive film at around room temperature, the thermal stress caused in the heating-cooling cycle due to the difference in coeffficient of thermal expansion between the semiconductor chip and the wiring board can be lowered, so that no crack is caused during reflow and no damage is observed after temperature cycle test, thus giving the adhesive film excellent in heat resistance.

However, when the reactive rubber is used, an adhesive of the film type or an adhesive parts using the same tends to change its property on storage in a time dependent-manner, due to a reactivity of the rubber, leading to a loss of fluidity and adhesiveness. Therefore, these films and adhesive parts are required to be stored in a refrigerated or frozen state, or to be used in a short time after it is purchased, leaving a problem as to handling unsolved.

In order to repress a reactivity of a rubber in a reactive rubber type adhesive and to improve a storing property thereof, a capsule type latent curing agent is used in some cases. However, an adhesive film to be used for CSP to which the present invention is objected has a problem such that the above-mentioned capsule type latent curing agent can not be used since the capsule is melt when it goes through several times of heat-treatments when it is laminated on a substrate such as polyimide and a semiconductor chip, prior to carrying out the final connection and adhesion-curing between the semiconductor chip and the substrate for mounting.

However, in the future, when requirements for heat resistance and reflow-resistance are set more strictly, it is necessary to give the adhesive higher levels of heat resistance and moisture resistance by elevating a peeling strength and an elasticity at a higher temperature. In addition, if oozing of the adhesive is considerable, it causes a failure in connectivity, such as failure in connection of electrodes, spoiling of a metal mold, etc., and this problem has to be solved. Further, if storing property is not sufficient, there arises a problem relating to a handling or a problem that flexibility in production is hindered, for example, an adhesive film has to be stored in a refrigerated or frozen state, or it has to be used in a short time after its purchase.

On the other hand, for a method for using an adhesive film for bonding a semiconductor chip and an outer connection part, or bonding semiconductor chips themselves, there are a punch and pressing method and a wafer back surface attaching and press-bonding method.

In the punch and pressing method, a film-press-bonding machine having both a film die-cutting function and a heat-pressing function is used. First, an adhesive film in a sheet form or a reel form is cut by a metal mold in a fixed size, and this is tentatively press-bonded onto a fixed position of an outer connection part. Subsequently, the adhesive film is heat-pressed and bonded using a pressing means. Further, a semiconductor chip is positioned on the adhesive film, and heat-pressed for bonding the outer connection part and the semiconductor chip.

In the wafer back surface attaching and press-bonding method, an adhesive film is attached on a back surface of a wafer onto which semiconductor chips are formed, by means of e.g., heat and pressure laminating method, and then, a dicing tape is laminated thereon. The wafer and the adhesive film are cut as a whole. Subsequently, the dicing tape is peeled off to give a semiconductor with an adhesive film, and this is heat-pressed for bonding to an outer connection part with wiring or another semiconductor chip.

In any method for press-bonding, in case of a face-up structure where a back surface of a chip is faced to the outer connection part, pressuring for bonding is carried out from a chip surface by using a pressing means, it is required that the chips should be pressed by a small pressure to prevent the chip from being broken. Especially in a recent year, in accordance with a trend for thinner and more laminated chips, it is required to carry out press-bonding by a smaller pressure and a lower temperature than ever.

Incidentally, the outer connection part has a structure in which a wiring layer is formed on a base comprising a film substrate such as polyimide, etc. and a rigid substrate such as BT resin, etc. It is categorized in a structure where a wiring layer is faced to a semiconductor chip or to outer connecting terminals, or a structure where wiring layers are provided on both surfaces of the substrate. In a circuit-in structure where the wiring layer is provided on the surface facing the semiconductor, there exists unevenness of about 5 to 20 µm due to a patterning of the wiring layer on a surface of the outer connection part to which the adhesive film is presse-bonded.

However, as to a conventional adhesive film, e.g., the adhesive film disclosed in Japanese Provisional Patent Publication No.2000-256628, filling property toward the unevenness is good under a pressure of 0.5 to 3.0 Mpa, however, when the pressure fells below 0.5 Mpa, filling of the adhesive film can not be fully performed, leaving voids on an adhesive interface. Such voids on the interface lowers a reliability including heat resistance and moisture resistance, therefore, the pressure below 0.5 Mpa has not been employed for bonding conventionally.

Generation of the voids depends on fluidity of the adhesive film, so it is possible to prevent a generation of voids by making melt viscosity small at a pressing temperature, however, when the melt viscosity is too small, excessive adhesive composition is oozed out from the peripheral of the adhesive film when the chip is pressed, causing a bonding failure at a lead terminal part. In addition, in case of using the wafer back surface attaching and press-bonding method, excessive oozing is caused, and a surface of a wafer or a laminated device is spoiled. Moreover, as to workability in a pressing process, there is a problem that the adhesive film adheres to a metal mold and a conveyer in the punch and pressing method, and in the wafer back surface attaching and press-bonding method, there is a problem that peeling a dicing tape is difficult. Therefore, the conventional adhesive films cannot achieve both press-bonding property and workability when it is pressed with a small pressure.

An object of the present invention is to provide an adhesive composition that has heat resistance and moisture resistance required for mounting a semiconductor chip whose coefficient of thermal expansion is largely different on a substrate for mounting a semiconductor, and further has an excellent oozing-resistance and circuit-filling property, as well as good storing property, a process for producing the same, an adhesive film using the same, a substrate for mounting a semiconductor and a semiconductor device.

Another object of the present invention is to provide an adhesive film for connecting semiconductor chips and an outer connection part with wiring which supports the chips, being able to perform bonding by heat-pressing with a pressure of 0.01 to 0.5 MPa, and being excellent in adhesiveness and workability upon press-bonding.

DISCLOSURE OF THE INVENTION

The adhesive composition of the present invention comprises (a) an epoxy resin, (b) a curing agent and (c) a polymer compound with a weight average molecular weight of 100,000 or more, wherein a ratio of A/B exceeds 1 and is 10 or less, when A represents the total weight of (a) the epoxy resin and (b) the curing agent, and B represents a weight of (c) the polymer. The adhesive composition of the present invention may comprises, as needs arises, (d) a filler and/or a curing accelerator.

The adhesive composition of the present invention also satisfies a relation of $H \geq 140 \times \phi^2$, wherein H (in hour) represents a half-life of a flow amount of a resin after heat-treatment at 60° C. and ($\phi$) represents a weight fraction of the weight of (c) the polymer compound (B) based on a total weight of (a) the epoxy resin, (b) the curing agent, and (c) the polymer compound (A+B).

In the adhesive composition of the present invention, preferably used as (c) the polymer is an acrylic copolymer containing 0.5 to 6.0% by weight of an epoxy group containing repeating unit, such as glycidylacrylate or glycidyl methacrylate, that is immiscible with an epoxy resin.

The adhesive composition of the present invention is characterized in that components of the adhesive composition are separated into two phases of a sea phase and an island phase, when viewed at a section in a cured state, and that a ratio X/Y is in a range of 0.1 to 1.0, wherein X represents an area of the sea phase and Y represents an area of the island phase, and especially, an area ratio of the sea phase on a surface is larger than that of the sea phase located 5 μm from the surface.

The adhesive film of the present invention is an adhesive film that connects a semiconductor chip and a substrate for mounting a semiconductor or connects semiconductor chips themselves, wherein it can perform bonding by heat-pressing with a pressure of 0.01 to 0.5 MPa. This adhesive film is characterized in that a melt viscosity thereof at a press-bonding temperature is in a range of 5×10 to 1×10⁵ Pa·s; it can perform bonding by heat-pressing under a condition where a pressure for press-bonding (F), time for press-bonding (t) and a melt viscosity at a temperature for press-bonding ($\eta$) satisfies the following formula;

$$1 \times 10 \leq F(Pa) \cdot t(s)/\eta(Pa \cdot s) \leq 5 \times 10^3$$

or a tack load measured according to Probe tack test at 25° C. is in a range of 2 to 20 gf.

The adhesive film of the present invention is characterized in that components of the adhesive composition are separated into two phases of a sea phase and an island phase, when viewed at a section in a cured state, and that a ratio X/Y is in a range of 0.1 to 1.0, wherein X represents an area of the sea phase and Y represents an area of the island phase, and an area ratio of the sea phase on a surface is larger than that of the sea phase located 5 μm from the surface.

The adhesive film of the present invention has a peeling strength at 240° C. of 50 N/m or more, an average coefficient of thermal expansion is 50 to 150 ppm/° C. at −65° C. to 150° C., and a storage elastic modulus of 20 to 2000 MPa at 25° C. and 3 to 50 MPa at 260° C.

The adhesive film with a support of the present invention comprises the afore-mentioned adhesive film laminated on one surface or both surfaces of a supporting film, either directly or intermediated by another layer.

The wiring board for mounting a semiconductor with the adhesive film of the present invention comprises the afore-mentioned adhesive film or an adhesive film with a support provided on a surface for mounting a semiconductor of a wiring board.

The semiconductor chip with the adhesive film of the present invention comprises the afore-mentioned adhesive film or the adhesive film with a support provided on a semiconductor chip.

The semiconductor device of the present invention comprises a structure in which plurals of semiconductor chips are laminated on one surface or both surfaces of a wiring board for mounting a semiconductor, wherein the adhesive film are used for bonding the wiring board for mounting a semiconductor and the semiconductor chip, or bonding the semiconductor chips themselves, when semiconductor chips are mounted.

BEST MODE FOR CARRYING OUT THE INVENTION

Figure 1:
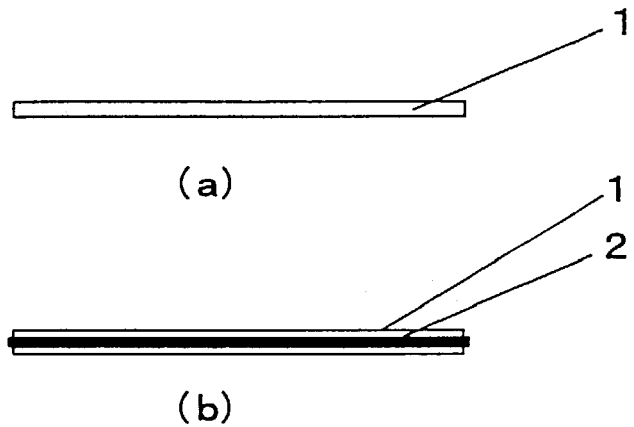
FIG. 1 shows an adhesive film of the present invention wherein (a) shows an adhesive film itself and (b) shows a case where adhesive films are adhered on both surfaces of a core material, in which 1 represents an adhesive film, and 2 represents a core material.

The present invention will be explained in more detail hereinafter.

With respect to (a) the epoxy resin used in the present invention, there is no particular limitation as long as it is cured to exhibit an adhesive action. An epoxy resin having two or more functional groups and preferably having a molecular weight of less than 5,000, more preferably less than 3,000 can be used. For example, bifunctional epoxy resins, such as a bisphenol A epoxy resin and a bisphenol F epoxy resin, and novolak epoxy resins, such as a phenolic novolak epoxy resin and a cresol novolak epoxy resin, can be used. In addition, generally known polyfunctional epoxy resins and heterocycle-containing epoxy resins can be used.

As these epoxy resins (a) which are commercially available, for example, bisphenol A epoxy resins such as EPIKOTE 807, EPIKOTE 815), EPIKOTE 825, EPIKOTE 827, EPIKOTE 828, EPIKOTE 834, EPIKOTE 1001, EPIKOTE 1002, EPIKOTE 1003, EPIKOTE 1055, EPIKOTE 1004, EPIKOTE 1004AF, EPIKOTE 1007, EPIKOTE 1009, EPIKOTE 1003F and EPIKOTE 1004F (manufactured by Japan Epoxy Resins Co., Ltd., trade name), DER-330, DER-301, DER-361, DER-661, DER-662, DER-663U, DER-664, DER-664U, DER-667, DER-642U, DER-672U, DER-673MF, DER-668 and DER-669 (they are manufactured by Dow Chemical Company, trade name), YD8125 and YDF8170 (manufactured by Tohto Kasei Co., Ltd., trade name); bisphenol F epoxy resins such as YDF-2004 (manufactured by Tohto Kasei Co., Ltd., trade name); phenolic novolak epoxy resins such as EPIKOTE 152 and EPIKOTE 154 (manufactured by Japan Epoxy Resins Co., Ltd., trade name), EPPN-201 (manufactured by Nippon Kayaku Co., Ltd., trade name) and DEN-438 (manufactured by Dow Chemical Company, trade name); cresol novolak epoxy resins such as EPIKOTE 180S65 (manufactured by Japan Epoxy Resins Co., Ltd., trade name), Araldite ECN1273, Araldite ECN1280 and Araldite ECN1299 (manufactured by Ciba Specialty Chemicals Inc., trade name), YDCN-701, YDCN-702, YDCN-703 and YDCN-704 (manufactured by Tohto Kasei Co., Ltd., trade name), EOCN-102S, EOCN-103S, EOCN-104S, EOCN-1012, EOCN-1020, EOCN-1025 and EOCN-1027 (manufactured by Nippon Kayaku Co., Ltd., trade name), ESCN-195X, ESCN-200L and ESCN-220 (manufactured by Sumitomo Chemical CO., Ltd., trade name); polyfunctional epoxy resins such as EPON 1031S, EPIKOTE 1032H60 and EPIKOTE 157S70 (manufactured by Japan Epoxy Resins Co., Ltd., trade name), Araldite 0163 (manufactured by Ciba Specialty Chemicals Inc., trade name), Denacol EX-611, Denacol EX-614, Denacol EX-614B, Denacol EX-622, Denacol EX-512, Denacol EX-521, Denacol EX-421, Denacol EX-411 and Denacol EX-321 (manufactured by Nagase Chemicals Ltd., trade name), EPPN501H and EPPN502H (manufactured by Nippon Kayaku Co., Ltd., trade name); amine epoxy resins such as EPIKOTE 604 (manufactured by Japan Epoxy Resins Co., Ltd., trade name), YH-434 (manufactured by Tohto Kasei Co., Ltd., trade name), TETRAD-X and TETRAD-C (manufactured by Mitsubishi Gas Chemical Company, Inc., trade name) and ELM-120 (manufactured by Sumitomo Chemical Co., Ltd., trade name); heterocycle-containing epoxy resins such as Araldite PT810 (manufactured by Ciba Specialty Chemicals Inc., trade name); and alicyclic epoxy resins such as ERL4234, ERL4299, ERL4221 and ERL4206 (manufactured by Union Carbide Corporation, trade name) can be used, and one kind or two or more kinds of them can also be used in combination.

In the present invention, in terms of heat resistance, an epoxy resin being in a solid state at room temperature and having a softening point of 50° C. or more as measured by a ring and ball method is preferably used in an amount of 20% by weight or more, more preferably 40% by weight or more, further preferably 60% by weight or more, based on the total weight of the epoxy resins used. Examples of such epoxy resins include a bisphenol A epoxy resin, a bisphenol F epoxy resin, a bisphenol S epoxy resin, an alicyclic epoxy resin, an aliphatic linear epoxy resin, a phenolic novolak epoxy resin, a cresol novolak epoxy resin, a bisphenol A novolak epoxy resin, diglycidyl ether compounds of a biphenol, diglycidyl ether compounds of a naphthalenediol, diglycidyl ether compounds of a phenol, diglycidyl ether compounds of an alcohol, and alkyl-substituted compounds, halides, and hydrogenation products thereof. These may be used in combination, and may contain an ingredient other than the epoxy resins as an impurity.

It is preferred to use an epoxy resin having a large molecular weight and having a softening point of 50° C. or more and a rubber in combination wherein the difference in polarity between the epoxy resin and the rubber is large since these are difficultly compatible to each other.

It is necessary that the epoxy resin be incompatible with the polymer compound, however, when two or more epoxy resins are used in combination as the epoxy resin, if the mixture of the epoxy resins is incompatible with the polymer compound, each of the epoxy resins is not necessarily incompatible with the polymer compound. For example, when epoxy resin YDCN703, which is solely incompatible with the polymer compound and which has a softening point of 50° C. or more, and epoxy resin EPIKOTE 828, which is compatible by itself with the polymer compound and which has a softening point of less than 50° C., are used in combination, a mixture of these epoxy resins in a weight ratio of 1:0 to 1:10 is incompatible with the polymer compound.

In addition, it is preferable to use a brominated epoxy resin as (a) the epoxy resin, since it will give a frame-retardant effect. As the brominated epoxy resin, a bifunctional epoxy resin containing bromine atoms and a novolak-type brominated epoxy resin may be used. As the bifunctional epoxy resin containing bromine atoms, there are listed, for example, YDB-360, YDB-400 (manufactured by Tohto Kasei Co., trade name), and as the novolak-type brominated epoxy resin, there are mentioned BREN-S, BREN-104 and BREN-301 (manufactured by Nihon Kayaku Co., trade name).

With respect to the curing agent (b) used in the present invention, there is no particular limitation as long as it can cure an epoxy resin. Examples of such curing agents include polyfunctional phenols, amines, imidazole compounds, acid anhydrides, organophosphorus compounds and halides thereof, polyamide, polysulfide and boron trifluoride.

Examples of the polyfunctional phenols include monocyclic bifunctional phenols, such as hydroquinone, resorcinol, and catechol; polycyclic bifunctional phenols, such as bisphenol A, bisphenol F, bisphenol S, a naphthalenediol, and a biphenol; and halides and alkyl-substituted compounds thereof. Further, examples include phenolic resins which are polycondensation products of the above phenols and aldehydes, such as a phenolic novolak resin, a resol resin, a bisphenol A novolak resin, and a cresol novolak resin.

Especially, it is preferable to use phenol resin as it is excellent in electrolytic corrosion resistance. There may be mentioned Varcum TD-2090 and Varcum TD-2131 (manufactured by Daihihon Ink Kagaku Kogyo Co., trade name) as the phenol-novolak resin, Plyophen VH4150 and Plyophen VH4170 (manufactured by Daihihon Ink Kagaku Kogyo Co., trade name) as a modified phenol-novolak resin, and Phenolite LF2882 and Phenolite LF2822 (manufactured by Daihihon Ink Kagaku Kogyo Co., trade name) as a bisphenol-novolak resin.

Further, in order to improve a frame retardancy of the resin, it is preferred to use brominated phenol compound as a curing agent, together with the brominated epoxy resin. As the brominated phenol compound, for example, tetrabromobisphenol A may be used and there may be mentioned Fireguard FG 2000 (manufactured by Teijin Kasei Kogyo Co., trade name).

In the present invention, it is preferred to use a phenolic resin having a hydroxyl group equivalent of 150 g/eq or more. With respect to the above phenolic resin, there is no particular limitation as long as it has the above-mentioned hydroxyl group equivalent value, and novolak type or resol type resins are preferably used because they have excellent electrolytic corrosion resistance when absorbing moisture.

As specific examples of the phenolic resins mentioned above, there can be mentioned phenolic resins represented by the following general formula (I):

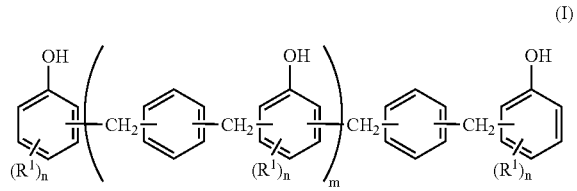

(I)

(wherein $R^1$ each independently represents a hydrogen atom, a halogen atom, a $C_1$–$C_{10}$ linear or branched alkyl group, a cyclic alkyl group, an aralkyl group, an alkenyl group, a hydroxyl group or an aryl group, n represents an integer of 1 to 3, and m represents an integer of 0 to 50).

With respect to such phenolic resin, there is no particular limitation as long as it is a compound represented by the formula (I), and from the viewpoint of moisture resistance, it is preferred that the phenolic resin exhibits a moisture absorption of 2% by weight or less after being placed in a thermo-humidistatic chamber at 85° C. at a relative humidity (RH) of 85% for 48 hours. Further, it is preferred to use a phenolic resin which exhibits a weight loss by heating at 350° C. (temperature elevation rate: 5° C./min; atmosphere: nitrogen gas) of less than 5% by weight as measured by a thermogravimetric analyzer (TGA) because volatilization of the volatile components is suppressed during heating and processing, thereby improving the reliability of various properties, such as a heat resistance and a moisture resistance, and contamination of the apparatuses due to the volatile components during operations can be reduced.

The phenolic resin represented by the formula (I) in the present invention can be obtained by, for example, reacting a phenolic compound with a xylylene compound comprised of divalent linking groups in the absence or presence of an acid catalyst.

Examples of the above mentioned phenolic resins include Milex XLC series and Milex XL series (manufactured by Mitsui Chemicals, Inc., trade names).

When the phenolic resin and the epoxy resin are used in combination, the ratio of the epoxy equivalent in the epoxy resin to the hydroxyl group equivalent in the phenolic resin is preferably 0.70/0.30 to 0.30/0.70, more preferably 0.65/0.35 to 0.35/0.65, further preferably 0.60/0.40 to 0.40/0.60, especially preferably 0.55/0.45 to 0.45/0.55. When the ratio falls outside of the above range, the resultant adhesive possibly has poor curing properties.

The phenolic compounds used for production of the phenolic resin of the formula (I) can be exemplified by phenol, o-cresol, m-cresol, p-cresol, o-ethylphenol, p-ethylphenol, o-n-propylphenol, m-n-propylphenol, p-n-propylphenol, o-isopropylphenol, m-isopropylphenol, p-isopropylphenol, o-n-butylphenol, m-n-butylphenol, p-n-butylphenol, o-isobutylphenol, m-isobutylphenol, p-isobutylphenol, octylphenol, nonylphenol, 2,4-xylenol, 2,6-xylenol, 3,5-xylenol, 2,4,6-trimethylphenol, resorcin, catechol, hydroquinone, 4-methoxyphenol, o-phenylphenol, m-phenylphenol, p-phenylphenol, p-cyclohexylphenol, o-allylphenol, p-allylphenol, o-benzylphenol, p-benzylphenol, o-chlorophenol, p-chlorophenol, o-bromophenol, p-bromophenol, o-iodophenol, p-iodophenol, o-fluorophenol, m-fluorophenol, p-fluorophenol, etc. These phenolic compounds may be used singly or by mixing two or more kinds thereof. Phenol, o-cresol, m-cresol, p-cresol, etc. are particularly preferred.

As the xylylene compound which is a divalent linking group to be used for production of the phenolic resin of formula (I), the following xylylene dihalides, xylylene diglycols and their derivatives can be used. Specifically, they include 1,1'-dichloro-p-xylene, 1,1'-dichloro-m-xylene, 1,1'-dichloro-o-xylene, 1,1'-dibromo-p-xylene, 1,1'-dibromo-m-xylene, 1,1'-dibromo-o-xylene, 1,1'-diiodo-p-xylene, 1,1'-diiodo-m-xylene, 1,1'-diiodo-o-xylene, 1,1'-dihydroxy-p-xylene, 1,1'-dihydroxy-m-xylene, 1,1'-dihydroxy-o-xylene, 1,1'-dimethoxy-p-xylene, 1,1'-dimethoxy-m-xylene, 1,1'-dimethoxy-o-xylene, 1,1'-diethoxy-p-xylene, 1,1'-diethoxy-m-xylene, 1,1'-diethoxy-o-xylene, 1,1'-di-n-propoxy-p-xylene, 1,1'-n-propoxy-m-xylene, 1,1'-di-n-propoxy-o-xylene, 1,1'-di-isopropoxy-p-xylene, 1,1'-diisopropoxy-m-xylene, 1,1'-diisopropoxy-o-xylene, 1,1'-di-n-butoxy-p-xylene, 1,1'-di-n-butoxy-m-xylene, 1,1'-di-n-butoxy-o-xylene, 1,1'-diisobutoxy-p-xylene, 1,1'-diisobutoxy-m-xylene, 1,1'-diisobutoxy-o-xylene, 1,1'-di-tert-butoxy-p-xylene, 1,1'-di-tert-butoxy-m-xylene and 1,1'-di-tert-butoxy-o-xylene. These compounds can be used singly or two or more kinds thereof can be used as a mixture. Of these, particularly preferred are 1,1'-dichloro-p-xylene, 1,1'-dichloro-m-xylene, 1,1'-dichloro-o-xylene, 1,1'-dihydroxy-p-xylene, 1,1'-dihydroxy-m-xylene, 1,1'-dihydroxy-o-xylene, 1,1'-dimethoxy-p-xylene, 1,1'-dimethoxy-m-xylene and 1,1'-dimethoxy-o-xylene.

In the reaction of the above-mentioned phenolic compound with the xylylene compound, using an acid catalyst, e.g., a mineral acid, such as hydrochloric acid, sulfuric acid, phosphoric acid, polyphosphoric acid, etc.; an organic carboxylic acid, such as dimethyl sulfate, diethyl sulfate, p-toluenesulfonic acid, methanesulfonic acid, ethanesulfonic acid, etc.; a superstrong acid, such as trifluoromethanesulfonic acid, etc.; a strong acid ion-exchange resin, such as an alkanesulfonic acid ion-exchange resin; a superstrong acid ion-exchange resins, such as a perfluoroalkanesulfonic acid ion-exchange resin (trade name: Nafion; manufactured by Du Pont Company); natural or synthetic zeolite; or activated clay (acid clay), etc., a reaction is carried out until the xylylene compound as a raw material substantially disappears at 50 to 250° C. and the composition of the reaction product becomes constant. The reaction time varies depending on the raw material and the reaction temperature, and it is generally about 1 hour to 15 hours, and may be actually determined while tracing the composition of the reaction product by gel permeation chromatography (GPC), etc. When a halogenoxylene derivative, such as 1,1'-dichloro-p-xylene, is exceptionally used, the reaction proceeds in the absence of a catalyst while generating the corresponding hydrogen halide gas. Therefore, in such a case, no acid catalyst is needed. In other cases, the reaction proceeds in the presence of an acid catalyst to generate water or alcohol, correspondingly. With respect to the molar ratio of the phenolic compound and the xylylene compound in the reaction, generally, the phenolic compound is used in an excess amount, and, after completion of the reaction, the unreacted phenolic compound is recovered. In this case, the average molecular weight of the phenolic resin depends on the amount of the phenolic compound used, and the larger the amount of the phenolic compound, the lower the average molecular weight of the phenolic resin obtained. A phenolic resin with the phenolic compound portion being an allylphenol can be obtained by, for example, a method in which a phenolic resin which is not allylated is prepared, and then, allylation is carried out by reaction with an allyl halide to form an allyl ether, followed by Claisen conversion.

Examples of the amines include aliphatic or aromatic primary amines, secondary amines, tertiary amines, quaternary ammonium salts, alicyclic amines, guanidines, urea derivatives, etc.

These compounds can be exemplified by N,N-benzyldimethylamine, 2-(dimethylaminomethyl)phenol, 2,4,6-tris(dimethylaminomethyl)phenol, tetramethylguanidine, triethanolamine, N,N'-dimethylpiperadine, 1,4-diazabicyclo[2.2.2]octane, 1,8-diazabicyclo[5.4.0]-7-undecene, 1,5-diazabicyclo[4.4.0]-5-nonene, hexamethylenetetramine, pyridine, picoline, piperidine, pyrrolidine, dimethylcyclohexylamine, dimethylhexylamine, cyclohexylamine, diisobutylamine, di-n-butylamine, diphenylamine, N-methylaniline, tri-n-propylamine, tri-n-octylamine, tri-n-butylamine, triphenylamine, tetramethylammonium chloride, tetramethylammonium bromide, tetramethylammonium iodide, triethylenetetramine, diaminodiphenylmethane, diaminodiphenyl ether, dicyanediamide, tolylbiguanide, guanylurea, dimethylurea, etc.

Examples of the imidazole compound include imidazole, 2-ethylimidazole, 2-ethyl-4-methylimidazole, 2-methyl-imidazole, 2-phenylimidazole, 2-undecylimidazole, 1-benzyl-2-methylimidazole, 2-heptadecylimidazole, 4,5-diphenylimidazole, 2-methylimidazoline, 2-phenylimidazoline, 2-undecylimidazoline, 2-heptadecylimidazoline, 2-isopropyl-imidazole, 2,4-dimethylimidazole, 2-phenyl-4-methylimidazole, 2-ethylimidazoline, 2-phenyl-4-methylimidazoline, benzimidazole, 1-cyanoethylimidazole, etc.

Examples of the anhydrides include phthalic anhydride, hexahydrophthalic anhydride, pyromellitic dianhydride, benzophenonetetracarboxylic dianhydride, etc.

With respect to the organophosphorus compound, there is no particular limitation as long as it is a phosphorus compound having an organic group, and examples include hexamethylphosphoric triamide, tri(dichloropropyl) phosphate, tri(chloropropyl) phosphate, triphenyl phosphite, trimethyl phosphate, phenylphosphonic acid, triphenylphosphine, tri-n-butylphosphine, and diphenylphosphine.

These curing agents can be used independently or in combination.

With respect to the blending amount of the curing agent, there is no particular limitation as long as the curing reaction of the epoxy group can proceed, but the curing agent is preferably used in an amount of 0.01 to 5.0 equivalents, especially preferably 0.8 to 1.2 equivalent, based on 1 mol of the epoxy group.

As the epoxy resin and the curing agent, it is preferred to use a compound having no mutagen, for example, a compound using no bisphenol A, since it has less influence on the environment and human bodies.

The polymer compound (c) having a functional group (reactivity) to be used in the present invention has a weight average molecular weight of 100,000 or more, and a glass transition temperature (Tg) of −50 to 0° C. There is no particular limitation on this polymer compound as long as it is incompatible with the epoxy resin. For examples, rubbers such as an acrylic copolymer, an acrylic rubber, etc., silicone resins, silicone modified resins such as silicone modified polyamideimide, etc. can be mentioned. To be incompatible with the epoxy resin means a property of being separated from the epoxy resin into two or more phases. The compatibility of the resins is defined as a visible light (600 nm) transmittance of a film (50 μm) prepared from a varnish containing the epoxy resin and the polymer compound (composition ratio=1:1). When the transmittance of the film is 50% or more, the polymer compound is "compatible" with the epoxy resin, whereas, when the transmittance is less than 50%, the polymer compound is "incompatible (is not compatible)" with the epoxy resin. In the present invention, it is preferred that the polymer compound is selected so that the transmittance is less than 30%.

As the functional group used in the present invention, glycidyl acrylate or glycidyl methacrylate being incompatible with an epoxy resin is preferred, and an epoxy group-containing acrylic copolymer having a weight average molecular weight of 100,000 or more is more preferred. The component (c) of the present invention can be obtained by carrying out a polymerization reaction so that unreacted monomers remain in a polymer compound, or by initially preparing a polymer compound, and then, adding reactive group-containing monomers thereto.

Incidentally, the weight average molecular weight is a polystyrene conversion value obtained by a gel permeation chromatography (GPC) method using a calibration curve obtained by standard polystyrene.

Examples of the acrylic copolymers include acrylic rubbers which are copolymers of an acrylate or a methacrylate and acrylonitrile. Further, from the viewpoint of excellent adhesiveness and heat resistance, an acrylic copolymer containing glycidyl acrylate or glycidyl methacrylate as a functional group is especially preferred. Especially preferred is an acrylic copolymer containing 0.5 to 6% by weight of this epoxy group containing repeating unit, based on the amount of the acrylic copolymer, and having a weight average molecular weight of 100,000 or more. As an acrylic copolymer containing 0.5 to 6% by weight of glycidyl acrylate or glycidyl methacrylate and having Tg of −50° C. or more and having a weight average molecular weight of 100,000 or more, for example, there can be mentioned HTR-860P-3 (manufactured by Teikoku Chemical Industries Co., Ltd., trade name).

Further, when the repeating units containing an epoxy group are contained in a range of 0.5 to 2.7% by weight based on an acrylic copolymer, it is possible to improve a storing stability of the adhesive film, while maintaining adhesiveness and preventing gelation, which is more preferred. Such an acrylic copolymer containing 0.5 to 2.7% by weight of the repeating units containing epoxy groups can be prepared using the above-mentioned HTR-860P-3.

As the remaining portion excluding the glycidyl acrylate or glycidyl methacrylate in the acrylic copolymer, an alkyl acrylate or an alkyl methacrylate having a $C_1$–$C_8$ alkyl group, such as methyl acrylate or methyl methacrylate, and a mixture of styrene and acrylonitrile, etc. can be used. Of these, ethyl (meth)acrylate and/or butyl (meth)acrylate is especially preferred. It is preferred that the mixing ratio is adjusted so that the Tg of the copolymer becomes −50° C. When Tg is lower than −50° C., the tack property of the adhesive layer or adhesive film in a B-stage tends to increase, whereby the handling properties becomes poor.

With respect to the polymerization method, there is no particular limitation, and examples include a pearl polymerization and a solution polymerization, and a copolymer is obtained by these methods.

The weight average molecular weight of the polymer compound of the present invention should be 100,000 or more, and preferably 300,000 to 3,000,000, more preferably 500,000 to 2,000,000. When the weight average molecular weight is in this range, it is possible to suitably control strength, flexibility and the tack property in a sheet form or in a film form, and at the same time, to give an excellent flowability to keep the circuit filling property for wiring good.

With respect to the addition amount of the above-mentioned (c) polymer compound incompatible with the epoxy resin, for reducing the elastic modulus and suppressing the flowability during shaping, the A/B ratio should exceed 1.0 and is 10 or less, where A represents the total weight of (a) the epoxy resin and (b) the curing agent, and B represents the weight of (c) the polymer compound incompatible with the epoxy resin. When the A/B ratio for the polymer compound is in this range, the handling properties at high temperatures is sufficiently attained. At the same time, the effects of reducing the elastic modulus and suppressing the flowability during shaping can be attained.

To the adhesive composition of the present invention, if desired, (d) a filler and/or (e) a curing accelerator can be further added.

Examples of (d) the filler used in the present invention include an inorganic filler and an organic filler. From the viewpoint of improving handling properties, improving thermal conductivity, adjusting melt viscosity and imparting thixotropic properties, etc., it is preferred to add an inorganic filler.

With respect to the inorganic filler, there is no particular limitation, and examples include aluminum hydroxide, magnesium hydroxide, calcium carbonate, magnesium carbonate, calcium silicate, magnesium silicate, calcium oxide, magnesium oxide, aluminum oxide, aluminum nitride, aluminum borate whisker, boron nitride, crystalline silica, amorphous silica, etc. These can be used independently or in combination. From the viewpoint of improving the thermal conductivity, aluminum oxide, aluminum nitride, boron nitride, crystalline silica, amorphous silica, etc. are preferred. From the viewpoint of adjusting the melt viscosity or imparting thixotropic properties, aluminum hydroxide, magnesium hydroxide, calcium carbonate, magnesium carbonate, calcium silicate, magnesium silicate, calcium oxide, magnesium oxide, aluminum oxide, crystalline silica, amorphous silica, etc. are preferred.

Examples of the organic filler include various rubber fillers, such as acrylonitrile-butadiene rubber fillers and silicone rubber fillers, etc. These have effects of improving the flexibility at low temperatures and reducing the elastic modulus.

It is more preferred that the filler used in the present invention has a contact angle with water of 0 to 100°. When the contact angle with water exceeds 100°, the effect attained by addition of the filler is likely to be lowered. The contact angle with water is preferably 0 to 60°, since the effect of improving a reflow resistance is especially high. Since contact angle of the filler and water changes depending on particle diameter of the filler which is mediated by composition of the filler, surface treatment thereof, and preparation process thereof, it can be controlled by, for example, using fumed silica or using finer fillers.

The contact angle of the filler with water is measured by the following method. A filler is subjected to compression molding to prepare a plane plate, and a water drop is placed on the plate and the angle of the water drop with the plate is measured by means of a contact angle meter. This measurement is repeated 10 times to obtain an average value, and this average value is used as a value of the contact angle.

It is preferred that the filler has an average particle diameter of 0.005 µm to 0.1 µm. When the average particle diameter of the filler is less than 0.005 µm, the dispersion property and the flowability tend to be lowered, and, on the other hand, when the average particle diameter exceeds 0.1 µm, the effect of improving the adhesiveness tends to be decreased.

Examples of the filler include silica, alumina, and antimony oxide. As the silica, NanoTek $SiO_2$ with a contact angle: 43 degrees; an average particle diameter: 0.012 µm (manufactured by C. I. KASEI CO., LTD., trade name) or Aerosil R972 with an average particle diameter: 0.016 µm (manufactured by Nippon Aerosil Co., Ltd., trade name) are listed. As the alumina, NanoTek $Al_2O_3$ with a contact angle: 55 degrees; an average particle diameter: 0.033 µm (manufactured by C. I. KASEI CO., LTD., trade name) is exemplified and as the diantimony trioxide, PATOX-U with a contact angle: 43 degrees; an average particle diameter: 0.02 µm (manufactured by Nihon Mining & Concentrating Co., Ltd., trade name) is exemplified.

It is preferred that the amount of the filler added is 0 to 50 parts by weight, based on 100 parts by weight of the total weight of the epoxy resin and the curing agent. When the amount of the filler used exceeds 50 parts by weight, problems may arise such that the storage elastic modulus increases and the adhesiveness becomes poor. The amount of the filler used is further preferably 5 to 40 parts by weight, especially preferably 10 to 30 parts by weight.

Further, in case of using the inorganic filler, those whose surface is treated with a surface-treating agent are preferred. As the surface-treating agent, there may be mentioned a silylating agent, an organofluorine compound, etc. As the silylating agent, there may be exemplified hexamethyl disilazane, dimethyldichloro silane, trimethylsilyl dimethyl amine, N,O-bis(trimethylsilyl)acetoamide, etc.

With respect to (e) the curing accelerator used in the adhesive composition of the present invention, there is no particular limitation. For example, tertiary amines, imidazoles, quaternary ammonium salts, etc. can be used. Examples of the imidazoles include 2-methylimidazole, 2-ethyl-4-methylimidazole, 1-cyanoethyl-2-phenylimidazole, 1-cyanoethyl-2-phenylimidazolium trimellitate, etc., and these can be used independently or in combination.

Imidazoles are commercially available from, for example, Shikoku Kasei Kogyo Co. in the trade names of 2E4MZ, 2PZ-CN, and 2PZ-CNS.

For prolonging the shelf life (usable period) of the film, the curing accelerator is preferred to have latency. Representative examples include dihydrazide compounds, such as dicyandiamide, adipic dihydrazide, etc., guanamine acid, melamine acid, addition products of an epoxy compound and an imidazole compound, addition products of an epoxy compound and a dialkylamine, addition products of an amine and thiourea, addition products of an amine and isocyanate, etc. From the viewpoint of reducing the activity at room temperature, it is preferred that the curing accelerator has an adduct structure.

As the adduct-type curing accelerator, there may be listed, for example, Amicure PN-23, Amicure MY-24, Amicure MY-D, Amicure MY-H, etc. (manufactured by Ajinomoto Co., trade mane), Hardener X-3615S, Hardener X-3293S, etc. (manufactured by A. C. R. Co., trade name), Novacure HX-3748, Novacure HX-3088, etc. (manufactured by Asahi Kasei Co., trade namef), Ancamine 2014AS, Ancamine 2014FG, etc. (manufactured by Pacific Anchor chemical Co., trade name) as an amine-epoxy adduct type. And as an amine-urea type adduct, there may be mentioned Fujicure FXE-1000, Fujicure FXR-1030 (manufactured by Fuji Kasei Co., trade name).

The blending amount of (e) the curing accelerator is preferably 0 to 5.0 parts by weight, more preferably 0.05 to 3.0 parts by weight, and further preferably 0.2 to 3.0 parts by weight, based on the total weight (100 parts by weight) of the epoxy resin and the curing agent. When the blending amount of the curing accelerator exceeds 5.0 parts by weight, the storage stability of the resultant composition becomes poor, so that the pot life is likely to be insufficiently short.

In the adhesive composition of the present invention, for improving the flexibility and the resistance to reflow crack, a high molecular-weight resin which is compatible with the epoxy resin can be added. With respect to the high molecular-weight resin compatible with the epoxy resin, there is no particular limitation, and, for example, phenoxy resins, high molecular-weight epoxy resins, extra-high molecular-weight epoxy resins, a large polarity functional group-containing rubbers, a large polarity functional group-containing reactive rubbers, etc. can be used.

As the phenoxy resins, Phenotot YP-40 and Phenotot YP-50 (manufactured by Tohto Kasei Co., Ltd., trade names), PKHC, PKHH, and PKHJ (manufactured by Phenoxy Associates CO., trade names) are exemplified.

Examples of the high molecular-weight epoxy resins include high molecular-weight epoxy resins having a molecular weight of 30,000 to 80,000 and extra-high molecular-weight epoxy resins having a molecular weight exceeding 80,000 (see Japanese Patent Publication Nos. 59617/1995, 59618/1995, 59619/1995, 59620/1995, 64911/1995, 68327/1995, etc.). As the large polarity functional group-containing reactive rubber, a carboxyl group-containing acrylonitrile-butadiene rubber is commercially available from JSR Co. in the trade name of PNR-1.

It is preferred that the amount to be used of the high molecular-weight resin compatible with the epoxy resin is 40 parts by weight or less, based on 100 parts by weight of the epoxy resin. When the amount exceeds 40 parts by weight, the Tg of the epoxy resin layer is possibly lowered.

To the adhesive composition of the present invention, various coupling agents can be further added for improving bonding at the interface between different materials. Examples of coupling agents include silane coupling agents, titanium coupling agents, and aluminum coupling agents, and silane coupling agents are most preferred.

The silane coupling agent is not particularly restricted. For example, there can be used vinyl group-containing silanes, such as vinyltriethoxysilane, vinyltris-(2-methoxyethoxy)-silane, etc.; methacryloyl group-containing silanes, such as γ-methacryloxypropyltrimethoxysilane, etc.; epoxy group-containing silanes, such as 2-(3,4-epoxycyclohexyl) ethyl-trimethoxysilane, 3-glycidoxypropyltrimethoxysilane, 3-glycidoxypropylmethyldimethoxysilane, etc.; amino group-containing silanes, such as N-2-(aminoethyl)-3-aminopropyltrimethoxysilane, N-2-(aminoethyl)-3-aminopropyl(methyl)dimethoxysilane, 3-aminopropyltriethoxysilane, N-phenyl-3-aminopropyltri-methoxysilane, 3-aminopropyl (methyl)diethoxysilane, 3-aminopropyl-tris(2-methoxyethoxy)silane, N-methyl-3-amiopropyltrimethoxysilane, tri-aminopropyltrimwthoxysilane, 3-(4,5-dihydroimidazol-1-yl)propyltrimethoxysilane, N-2-(N-vinylbenzylaminoethyl)-3-aminopropyltrimethoxysilane, etc.; mercapto group-containing silanes, such as 3-mercaptopropyltrimethoxysilane, 3-mercaptopropyltriethoxysilane, 3-mercaptopropyl (methyl)dimethoxysilane, etc.; ureido group-containing silanes, such as 3-ureidopropyltriethoxysilane, 3-ureidopropyltrimethoxysilane, etc.; isocyanate group-containing silanes, such as trimethylsilyl isocyanate, methyltriisocyanate silane, vinyltriisocyanate silane, phenyltriisocyanate silane, tetraisocyanate sline, etc.; carbon functional chloro-containing silanes such as 3-chloropropyl (methyl)dimethoxysilane, 3-chloropropyltrimethoxysilane, 3-chloropropyl(methyl)diethoxysilane, etc.; cyano group-containing silanes, such as 3-cyanopropyltriethoxysilane, etc.; quaternary ammonium group-containing silanes, such as octadecyldimethyl[3-(trimethoxysylil)propyl]ammonium chloride, etc., and a combination of one or two kinds or more of the above.

As the titanium coupling agent, there can be mentioned isopropyltrioctanoyl titanate, isopropyldimethacrylisostearoyl titanate, isopropyltridodecylbenzenesulfonyl titanate, isopropylisostearoyldiacryl titanate, isopropyltri(dioctylphosphate) titanate, isopropyltricumylphenyl titanate, isopropyltris(dioctylpyrophosphate) titanate, isopropyltris (n-aminoethyl) titanate, tetraisopropylbis(dioctylphosphite) titanate, tetraoctylbis(ditridecylphosphite) titanate, tetra(2, 2-diallyloxymethyl-1-butyl)bis(ditridecyl)phosphite titanate, dicumylphenyloxyacetate titanate, bis(dioctylpyrophosphate)oxyacetate titanate, tetraisopropyl titanate, tetranormalbutyl titanate, butyl titanate dimer, tetra(2-ethylhexyl) titanate, titanium acetylacetonate, polytitanium acetylacetonate, titanium octylene glycolate, titanium lactate ammonium salt, titanium lactate, titanium lactate ethyl ester, titanium triethanol aminate, polyhydroxytitanium stearate, tetramethyl orthotitanate, tetraethyl orthotitanate, tetrapropyl orthotitanate, tetraisobutyl orthotitanate, stearyl titanate, cresyl titanate monomer, cresyl titanate polymer, diisopropoxy-bis(2,4-pentadionate) titanium (IV), diisopropyl-bis-triethanolamino titanate, octyleneglycol titanate, tetra-n-butoxy titanium polymer, tri-n-butoxytitanium monostearate polymer, tri-n-butoxytitanium monostearate, etc. These compounds can be used singly or in combination of two or more kinds thereof.

As the aluminum coupling agent, there can be mentioned, for example, aluminum chelate compounds such as ethylacetoacetate aluminum diisopropylate, aluminum tris(ethylacetoacetate), alkylacetoacetate aluminum diisopropylate, aluminum monoacetylacetatobis(ethylacetoacetate), aluminum tris(acetylacetonate), aluminum-monoisopropoxymono-oleoxyethyl acetoacetate, aluminum-di-n-butoxide-mono-ethylacetoacetate, aluminum-di-iso-propoxide-mono-ethylacetoacetate, etc., and aluminum alcholates such as aluminum isopropylate, mono-sec-butoxyaluminum diisopropylate, aluminum sec-butyrate, aluminum ethylate, etc. These compounds can be used singly or in combination of two or more kinds thereof.

In view of obtaining effects and heat resistance thereof as well as reducing the cost, it is preferred that the amount of the coupling agent added is 0 to 10 parts by weight, based on 100 parts by weight of the total weight of the resins.

Further, to the adhesive composition of the present invention, for adsorbing an ionic impurity to improve the insulation reliability when absorbing moisture, an ion-capturing agent can be added. With respect to the ion capturing agent, there is no particular limitation, and a compound known as an anti-copper damage agent for preventing copper from ionizing and dissolving out, for example, a triazinethiol compound and a bisphenol reducing agent can be used. As the copper damage preventing agent containing triazinethiol compound, Gisnet DB (available from Sankyo Seiyaku Co., trade name) can be mentioned, and as the copper damage preventing agent containing bisphenol reducing agent, Yoshinox BB (available from Yoshitomi Seiyaku Co., trade name) can be mentioned. In addition, inorganic ion adsorbents, such as zirconium type, antimony type, bismuth type, magnesium type, and aluminum type compounds can be used, and various kinds of the compounds are commercially available from Toa Gosei Kagaku Kogyo Co. under a trade name of IXE.

In view of obtaining an effect aimed at by the addition and excellent heat resistance and reducing the cost, it is preferred that the amount of the ion capturing agent added is 0 to 10 parts by weight, based on 100 parts by weight of the adhesive composition.

The above-mentioned adhesive composition of the present invention maybe coated on a support as a single layer, followed by heating and curing to give an adhesive film, and also, more than two kinds of adhesive compositions may be layered to give an adhesive film.

In this case, it is preferred that the first adhesive layer comprises the above-mentioned adhesive composition and has a curing degree according to differential scanning calorimeter analysis (DSC) in a range of 0 to 40%, and the second adhesive layer has a curing degree by DSC after heating and drying in a range of 0 to 40%, and its content of the polymer compounds is greater than that of the first film by 10 parts by weight or more, or a curing degree by DSC of the second layer after heating and drying is greater than that of the first layer by 5% or more. By changing the content of the polymer compound or the curing degree by DSC as such, as compared to the first layer, sufficient circuit filing property and oozing resistance from through-holes can be achieved at the same time. Further, it is more preferred that the contents of the polymer compound in the second layer is greater than that of the first layer by 10 to 40 parts by weight, or the curing degree by DSC is greater than that of the first layer by 5 to 20%

Incidentally, the curing degree of an adhesive layer after drying is measured by total calorific value for curing at a state where heat generation ceased, and it was measured using DSC (912 type DSC manufactured by Du Pont Co.), with a raising temperature rate of 10° C./minute.

As mentioned above, each of the adhesive composition and the adhesive film of the present invention comprises a composition comprising (a) an epoxy resin, (b) a curing agent, (c) a polymer compound incompatible with the epoxy resin, and optionally (d) a filler and/or (e) a curing accelerator, wherein the components are separated into two phases after being cured as viewed in the cross-section thereof.

The term "two phases" used here indicates that the cured product has an islands-in-sea structure. The "islands-in-sea structure" in the present invention means a ununiform structure comprising a continuous phase (referred to as "sea") and a dispersed phase (referred to as "islands") described in, for example, page 16 of "Polymer New Material one point Polymer Alloy", published by KYORITSU SHUPPAN CO., LTD., as viewed in the cross-section of the adhesive composition in a cured state, which is polished and examined under, e.g., a scanning electron microscope. In the adhesive composition of the present invention, (c) the polymer compound comprises a sea phase, and (a) the epoxy resin and (b) the curing agent thereof comprise an island phase.

Further, in a section of the adhesive film of the present invention after heating and curing, when X represents an area of the sea phase and Y represents an area of the island phase in the section, a ratio X/Y falls in a range of 0.1 to 1.

Figure 6:
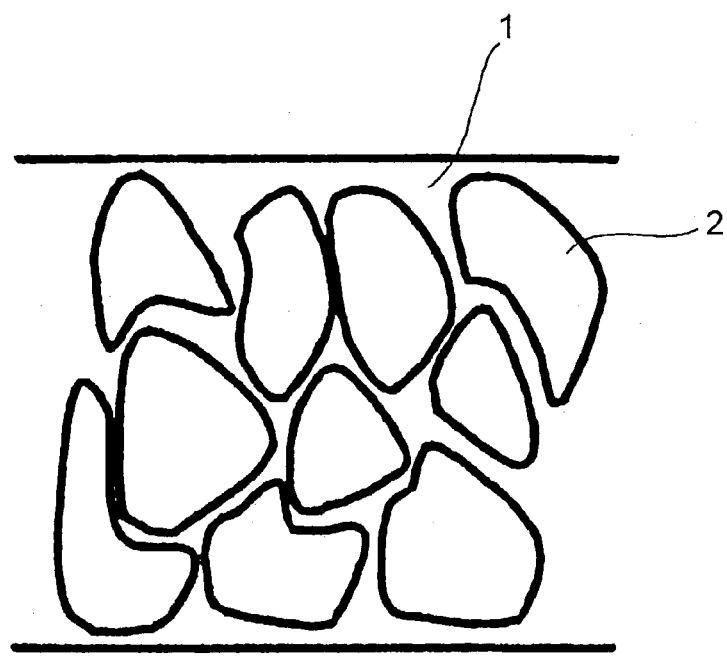
FIG. 6 shows a construction of two-phase structure in which sea phase prevails on a surface and island phase prevails in inside of the film, wherein 1 represents a sea phase and 2 represents an island phase.

Further, adhesive film of the present invention, as shown in FIG. 6, is characterized in that the sea phase comprising the polymer compounds appears more frequently in a proximate of a surface of the adhesive film, and the epoxy resin and the curing agent appearing as the island phase are less precipitated. As shown above, the island phase appears less frequently and the sea phase appears more frequently on a surface of the adhesive film, it elevated adhesiveness at an interface. On the other hand, in the inside of the adhesive film, for example, at a position 5 μm from the surface, the island phases are precipitate frequently, therefore, even when a crack is generated, it serves to prevent the crack from spreading. Further, the adhesive composition of the present invention can give an adhesive film with a bi-phase structure in which the sea phase prevails on the film surface and the island phase prevails in inside of the film, only by coating a varnish on a support.

The ratio X/Y of the island phase and the sea phase in the sectional area is measured as follows.

(1) In a photo of a section of the adhesive film by a scanning electronic microscope (SEM), a square with a side of 10 μm long is set randomly.

(2) A transparent film with a uniform density (ρ) and a film thickness (t) is mounted on this SEM photo, and all the islands are traced by a pen along their shapes, detaching the island parts, and measuring the weight (Wx) of the detached film. Wx corresponds to Sx (surface area of the island parts) X ρ X t.

(3) As to an area for the sea phase, from the square with a side of 10 μm long, an area which is left behind after removing the island parts (the sea parts) are detached in the same manner as the above, and a weight of the detached film (Wy) is measured. Similarly, Wy corresponds to Sy×ρ×t.

(4) A ratio of Wx/Wy is Sx×ρ×t/Sy×ρ×t=Sx/Sy, which corresponds to a ratio of surface areas.

(5) Procedures (1) to (4) are repeated for 5 times, and an obtained average value of Wx/Wy is taken as X/Y.

In the present invention, each of the adhesive composition and the adhesive film of the present invention wherein the components thereof are separated into two phases after being cured in the section thereof, is attained by an adhesive composition which comprises an epoxy resin, a cyanate resin, a phenolic resin and a curing agent thereof, a polymer compound incompatible with these resins, for example, an acryl rubber, an acrylonitrile-butadiene rubber, a silicone rubber, polyurethane, polyimide, polyamideimide, and a copolymer or a mixture thereof, and optionally a filler and/or a curing accelerator, or by an adhesive film obtained by heating and curing the adhesive film.

In the present invention, from the viewpoint of obtaining excellent adhesion between the sea phase and the island phase and excellent adhesiveness, it is preferred that the two phases comprise a sea phase and an island phase and satisfy a relationship represented by the following formula (1):

$$S/\sqrt{V} > 3.6 \qquad (1)$$

wherein a length of an outer periphery of the island phase represented by S and an area of a section represented by V. Further, from the viewpoint of obtaining still higher adhesion between the sea phase and the island phase, it is preferred that, in the above formula (1), the relationship: $S/(V^{1/2}) > 4.0$ is satisfied.

In the present invention, there is provided an adhesive film which can attain a long half-life of a resin flaw rate after a heat-treatment at 60° C., relative to a ratio of the polymer contained in the adhesive composition.

That is, the adhesive composition of the present invention also satisfies a relation of $H \geqq 140 \times \phi^2$, wherein (H, in hour) represents a half-life of a flow amount of resin after heat-treatment at 60° C. and ($\phi$) represents a weight fraction of a weight of the polymer (B) based on the total amount of the epoxy resin, the curing agent, and the polymer (A+B). This results in an adhesive film that has connection reliability and heat resistance at the same time, has a longer storage life at room temperature, thereby enabling a prolonged storage and ensuring a storing stability.

Incidentally, a decreased amount of the flaw rate is measured as follows. Adhesive films are left in a thermostatic bath kept at 60° C., for 12 h, 24 h, 48 h, 72 h, 96 h, 120 h, 180 h and 240 h, and then, the adhesive films for testing are taken out and each sample is cut out in a rectangular shape of 2 cm×1 cm. Using a heat press machine (manufactured by Tester Sangyo Co.), a pressure of 2 MPa is applied on the sample for 18 seconds on a stage heated at 160° C. After heating, using 4 samples, a maximum flaw width of the adhesive oozed out from the long side of the rectangular is measured at 2 points for each sample, and an average thereof is taken as a flow amount. A flow amount of an untreated sample without being kept at 60° C. is taken as an initial value. The initial value is compared to flaw amounts of the samples taken out after heating for respective period of time, and a treating time when the flow amount is decreased by 50% is defined as a half-life. The relation between the flow amounts and the treating time is plotted to give a curve and the half-life is obtained from the curve.

The adhesive composition of the present invention has a small weight-loss rate of 2% by weight or less when it is heated at 270° C. This prevents it from spoiling the peripheral device when it is used.

The adhesive film obtained by heating and drying the adhesive composition of the present invention is press-bonded onto an outer connection part in a semi-cured state (B stage), and cured. At this point, when residual volatile composition remains in a large amount, the film itself produces foams at the time of curing, producing a void inside the film and lowering reliability. When relation between foaming at curing and an amount of residual volatile component is studied, it has been found that by keeping the amount of residual volatile component 3% or less, foaming is decreased at a time of curing. Further, the amount of the residual volatile component of the adhesive film is calculated from the formula (2), from the weights of the adhesive film before and after curing at 170° C./1 h.

The residual volatile component fraction (%)= [(weight of the film before curing−weight of the film after curing)/weight of the film before curing]×100 (2)

In the present invention, there is provided an adhesive film having a tensile modulus of elasticity of 1 to 10 MPa at 240° C. This ensures thermal stress moderating property and at the same time, prevents generation of a bend of the film and generation of a reflow crack.

Incidentally, the measurement of the tensile modulus of elasticity is carried out as follows. First, an adhesive composition with an initial length of 20 mm (L) and a thickness of 50 µm is cured at 170° C. for 1 hour, to prepare a cured film. The cured film is bathed in a thermostatic bath kept at 240° C., while applying a constant load of 1 to 10 kg to the cured film. After the film is put in the bath and its temperature reaches 240° C., elongated length (ΔL) and sectional area (S) of the cured film are measured, from which tensile modulus of elasticity (E') is calculated according to the formula (3) below:

$$E' = L \cdot W/(\Delta L \cdot S) \qquad (3)$$

In the present invention, there is provided an adhesive film comprising a laminated cured product of the adhesive composition of the present invention and a polyimide film, which exhibits a peeling strength measured at 240° C. of 50 N/m or more.

Measurement of the peeling strength is carried out as follows. Using a hot roll laminator, polyimide films with a thickness of 50 µm are attached on both surface of the adhesive film and cured under conditions of temperature: 80° C., press-bonding rate: 0.3 m/minute, and pressure: 0.3 MPa. The laminated and cured product is cut with a width of 10 mm to give an evaluation sample, and a value is obtained when the film is peeled at an angle of 180° at a peeling rate of 50 mm/minute, using Tensilon: tensile testing machine (manufactured by TOYO BALDWIN Co., trade name:UTM-4-100). Three samples are measured, and an average value is taken as peeling strength.

In the present invention, there is provided an adhesive film which does not suffer peeling with a diameter of 2 mm or more in the laminated and cured product, in a heat treatment at 260° C. for 120 seconds after moisture absorption.

The peeling property of the polyimide laminated product after moisture absorption is evaluated as follows. In the same manner as used for a measurement of peeling strength, polyimide films with a thickness of 50 µm are attached on both surface of the adhesive film and cured, and the laminated and cured product is cut into a size of 25 mm×25 mm to give an evaluation sample. In a thermostatic bath, the samples are subjected to moisture absorption for 48 hours under condition of temperature: 85° C. and relative humidity (RH): 85%. The samples are taken out and placed in a solder bath kept at 240, 260 and 280° C., respectively. They are observed with respect to existence of peeling.

In the present invention, there is provided an adhesive film with a low elasticity modulus, whose storage elastic module is 10 to 2000 MPa at 25° C. and 3 to 50 MPa at 260° C. This leads to an effect for moderating thermal stress generated due to a difference in coefficient of thermal expansion between a semiconductor chip and a supporting material, thereby preventing peelings and cracks. Further, it is excellent in handling property of the adhesive and in accuracy of a thickness of the adhesive layer, thereby preventing generation of reflow crack.

Measurement of storage elastic module is carried out using a dynamic modulus of viscoelasticity measuring device (manufactured by Reology Co., DVE-V4), applying a tensile load to the adhesive cured product, under condition of frequency of 10 Hz and temperature elevating rate of 5 to 10° C./minute, according to a temperature-dependent measurement mode in which measurement is carried out from −50° C. to 300° C.

In the present invention, there is provided a semiconductor device which does not suffer peeling with a diameter of 1 mm or more between the adhesive layer and a semiconductor chip, when it passes through are flow furnace kept at 260° C. for 120 seconds, after 168 hours of moisture absorption treatment at 85° C. and relative humidity of 85%.

Measurement of the reflow resistance is carried out as follows. To an adhesive film, a semiconductor chip and a wiring board using a polyimide film with a thickness of 25 µm as a support are attached and cured, to prepare a semiconductor device sample having solder balls formed on single piece thereof. According to JEDEC standard J-STD-020A, this semiconductor device sample is passed through an IR reflow furnace whose temperature is set so that the maximum temperature on a surface of the sample is kept at 245° C. or 265° C. for 20 seconds, and cooled down by leaving it at room temperature. This cycle is repeated for 3 times, and the sample is observed by direct observation or by an ultrasonic microscope whether or not peelings and cracks are generated in the sample.

In the present invention, there is further provided an adhesive film for connecting semiconductor chips, that is excellent in adhesiveness and workability upon pressing, which can be thermally press-bonded with a small pressure of 0.01 to 0.5 MPa in connecting a semiconductor chip and an outer connection part with a wiring which supports the chip or connecting semiconductor chips themselves. In order to obtain an excellent press-bonding property with such a small pressure as in the present invention, it is important to control a melt viscosity at a press-bonding temperature of the adhesive film in a specific range.

Characteristic values of the adhesive film have a large influence on press-bonding property and laminating property of the adhesive film. That is, as controlling factors of press-bonding property and laminating property evaluated by an existence of voids and amount of oozing, there are mentioned melt viscosity, press-bonding temperature, press-bonding pressure, press-bonding time and a thickness of the adhesive film. However, the press-bonding time and a thickness of the adhesive film is determined by production efficiency and values required for the film, whereby it has less freedom since it is practiced in a limited range. Therefore, main controlling factors are melt viscosity of the film and a press-bonding pressure at a press-bonding temperature and a laminating temperature.

Using adhesive films different in melting viscosities, influence that the melt viscosity has on press-bonding property and laminating property is studied quantitatively, and it is found that an excellent press-bonding property and laminating property are obtained when the adhesive film has a melt viscosity of $1\times10^4$ Pa·s or more at 100° C. or less, and has a melt viscosity in a range of $5\times10$ to $1\times10^5$ Pa·s at press-bonding temperature.

In this case, the melt viscosity of the adhesive film is measured by parallel plate plastmeter method, and evaluated by a calculated value. That is, melt viscosity ($\eta$) of the adhesive film is obtained by measuring change in thickness of the adhesive film by applying a load to an adhesive film with a radius of r for a predetermined time, and by solving the following equation (4) with respect to $\eta$:

$$t = \eta \frac{3V^2}{8\pi F}\left(\frac{1}{z^4} - \frac{1}{z_0^4}\right) \quad (4)$$

(wherein $z_0$ represents a thickness of an adhesive film before applying load, z represents a thickness of the adhesive film after applying load, V represents a volume of the adhesive film, F represents load applied, and t represents a time for applying load).

Adhesive films different in composition of a several kinds of resins are prepared, and the adhesive films are press-bonded onto an outer connection part having a surface unevenness, varying a press-bonding temperature and a press-bonding time in some cases. It is studied how the melt viscosity and the press-bonding pressure have an effect on the press-bonding property and the laminating property of the adhesive film, that is, on void and oozing. In order to carry out bonding by press-bonding with a small pressure of 0.5 MPa or less, without leaving voids, the melt viscosity of the adhesive film at a press-bonding temperature should be $1\times10^5$ Pa·s or less. Also as to an amount of oozing, in order to keep the oozing amount 50 µm or less, the melt viscosity of the adhesive film at a press-bonding temperature should be $5\times10$ Pa·s or more.

Incidentally, a pressure range is set at 0.5 MPa or less, because, in case of applying a pressure from a chip surface by using a tool, if the pressure exceeds this range, the chip might be destroyed. And the amount of oozing is set at 50 µm or less, because, in accordance with a recent trend of high density, distance between the chip terminals and the lead-bonding terminals of the outer connection part has become smaller, and it is impossible to carry out lead-bonding if oozing of the adhesive film exceeds 50 µm or more, since it reaches the terminals. Therefore, by controlling the melt viscosity of the adhesive film at a press-bonding temperature in a range of $5\times10$ to $1\times10^5$ Pa·s, preferably, in a range of $1\times10^2$ to $1\times10^4$ Pa·s at a temperature range of 140 to 180° C., it is possible to carry out press-bonding even with a small pressure, without causing voids and excessive oozing.

Figure 4:
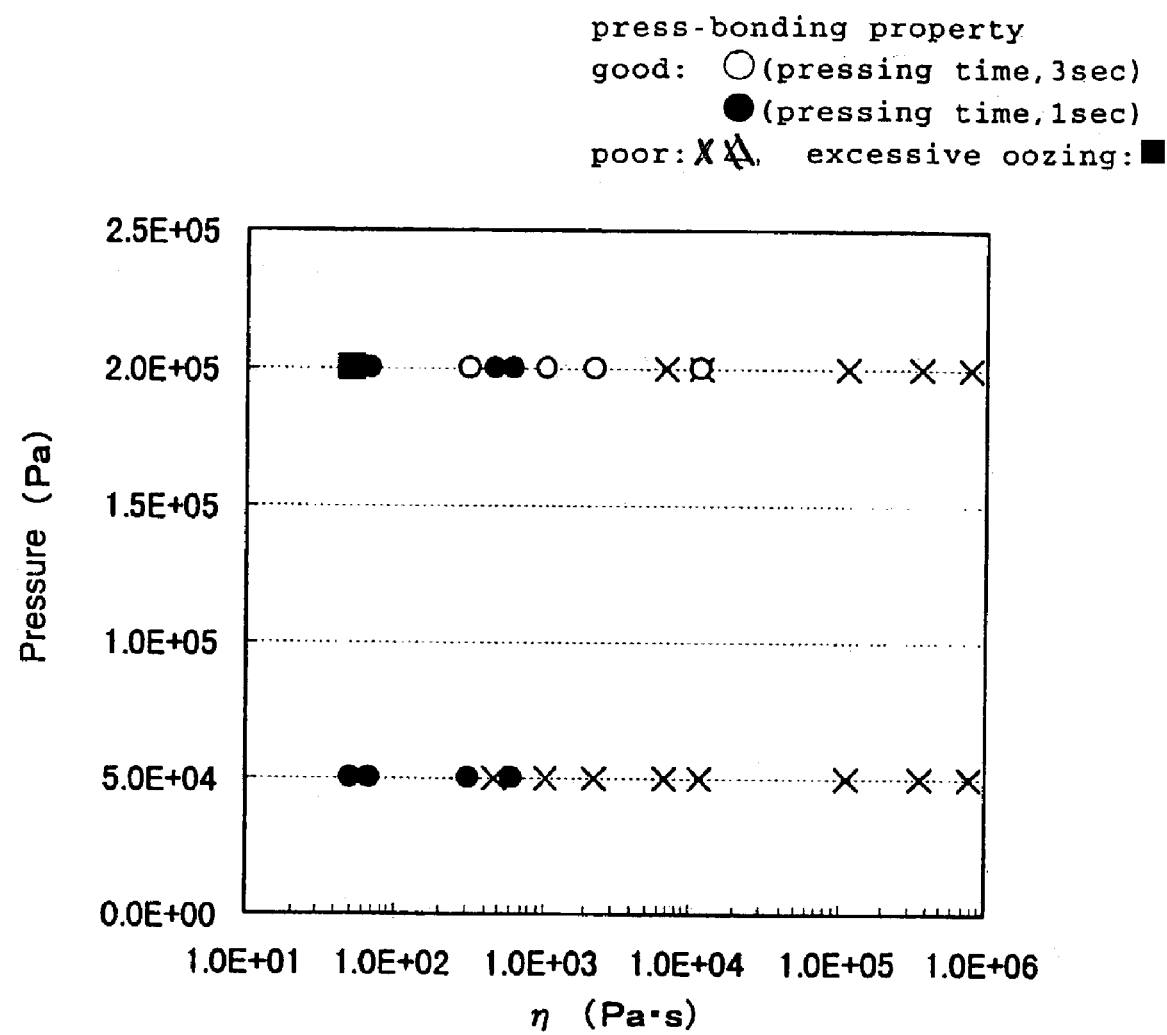
FIG. 4 shows a relation between a pressure of press-bondingS (F) and a melt viscosity ($\eta$) at a pressing temperature, which influence an press bonding property of the adhesive film of the present invention.

When the data from Examples and Comparative Examples are analyzed, when the melt viscosity of the adhesive film falls within the above-mentioned range, as shown in FIG. 4, the smaller the melt viscosity is, it is possible to carry out thermal press-bonding with a smaller pressure.

Figure 5:
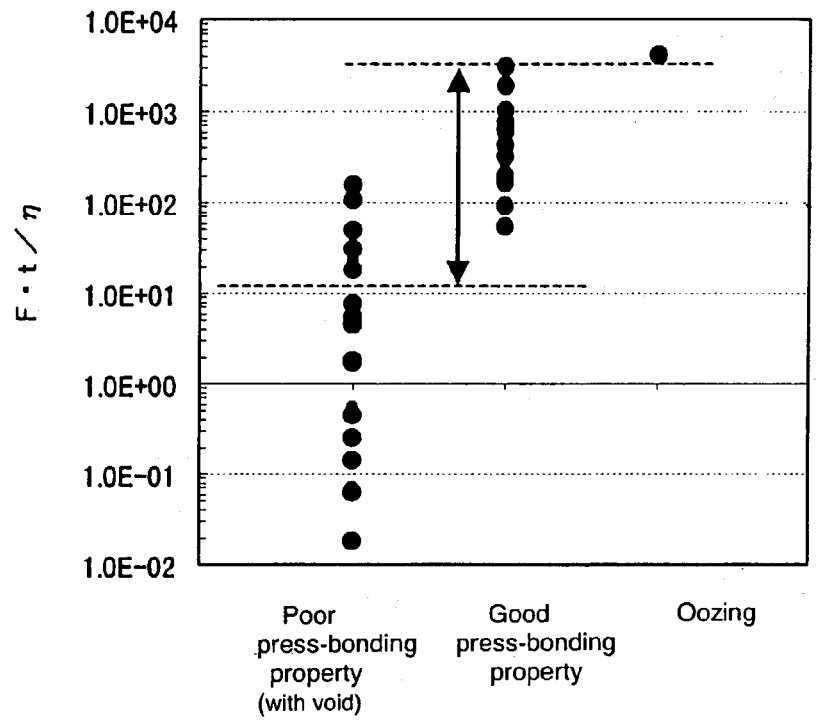
FIG. 5 shows a relation among pressure of press-bonding (F), a pressing time (t) and melt viscosity ($\eta$) at a pressing temperature, which influence press bonding property and oozing property of the adhesive film of the present invention.

Moreover, when relation between parameters $F(Pa)\cdot t(s)/\eta(Pa\cdot s)$, using a melt viscosity at a press-bonding temperature ($\eta$), a press-bonding pressure(F), press-bonding time (t), and press-bonding property are analyzed, as shown in FIG. 5, the adhesive film satisfying the following equation (5);

$$1\times10 \leq F(Pa)\cdot t(s)/\eta(Pa\cdot s) \leq 5\times10^3$$

can be press-bonded without causing voids and excessive oozing.

Further, in a wafer back surface attaching and press-bonding method, since a back surface of a wafer has no unevenness on the surface different from the outer connection part, laminating an adhesive film thereon is carried out under condition of a temperature at around 100° C. which is lower than a press-bonding temperature, and with a line pressure of 0.1 to 10 MPa. Also in this case, relation between the melt viscosity of the adhesive film and oozing of the adhesive film from the wafer terminal after laminating is studied, the melt viscosity of the adhesive film at a laminating temperature has to be about $1 \times 10^4$ Pa·s or more, in order to laminate without causing an ooze of the adhesive film resin onto a surface of the wafer.

Therefore, it is preferred to set a ratio of the melt viscosties of the adhesive film at 100° C. and 180° C. in a range of $1 \times 10$ to $1 \times 10^3$. When the ratio of the melt viscosities is in this range, temperature dependency of the melt viscosity is proper, and it is possible to have a wide temperature range for carrying out press-bonding, and it is possible to achieve the above-mentioned suitable range for the melt viscosity, at the above-mentioned temperature of 100° C. and at a press-bonding temperature of 140° C. to 180° C.

Further, also as to adhesion of the adhesive film onto a metal dicing mold or onto a conveyer, and as to peeling from a dicing tape, correlations with the properties of the adhesive film are studied, and it was found that they have a correlation with an adhesiveness at room temperature. As an index of adhesiveness, that is tack property, Probe tack test method as described in JISZ0237 is used. Probe tack test method is a method in which a prove is contacted with an adhesive film while applying a predetermined load for a predetermined time, and then, a force is measured required for peeling a probe from the adhesive film in a vertical direction. As to adhesion to a metal mold and peeling from a dicing tape, when a tack load measured at 25° C. by the Probe tack method is in a range of 2 to 20 gf, there is observed no adhesion to the metal mold, and peeling from the dicing tape is possible, thereby being excellent in workability, since adhesiveness between the adhesive film and the protective film is good.

The melt viscosity ($\eta$) of the adhesive film at a press-bonding temperature can be adjusted in the above-mentioned range by a blending amount of the adhesive composition and by coating conditions to prepare an adhesive film based on the blending ratio of the resin composition, that is, by degree of B stage.

As to the blending amount of the adhesive composition, in order to adjust the melt viscosity ($\eta$) of the adhesive film at a press-bonding temperature in a range of $5 \times 10$ to $1 \times 10^5$ Pa·s, a ratio A/B is preferably in a range exceeding 1 and 3.3 or less, where A is the total weight of the epoxy resin and the curing agent, and B is a weight of the polymer compound. In addition, in order to control the melt viscosity of the adhesive film at 140 to 180° C. in a range of $1 \times 10^2$ to $1 \times 10^4$ Pa·s, A/B is particularly preferably in a range of 1.25 to 3.3. Further, the weight average molecular weight of the polymer is preferred to be from 300,000 to 800,000.

On the other hand, it is possible to control a melt viscosity of the adhesive film by adjusting a semi-cured state of the film by a coating condition for filming a resin varnish, such as coating temperature and coating time. Especially, the melt viscosity of the adhesive film can be adjusted in the range of the present invention by heating and drying at a moderately low temperature of 80 to 100° C. after coating the resin varnish, followed by selecting an appropriate heating temperature and a heating time within a range of 110 to 150° C. based on the resin composition.

In order to adjust the tack load of the adhesive film measured at 25° C. within a range of 2 to 20 gf, the ratio A/B is more preferably in a range exceeding 1 and 3.3 or less, where A is the total amount of the epoxy resin and the curing agent thereof and B is the amount of the polymer compound, and is especially preferably in a range of 1.25 to 3.3. Further, a weight average molecular weight of the polymer compound is preferably in a range of 300,000 to 800,000. In addition, the tack load can be adjusted in a range of 2 to 20 gf by controlling a coating condition at the time of production of the film.

Further, the adhesive film using the adhesive composition of the present invention in a B stage, which has a bi-phase structure in which the island phase appears less frequently on the surface is preferred since it shows a smaller tack load and high fluidity.

The above-mentioned residual volatile component fraction in the adhesive composition is also a factor affecting the tack load. When more of the residual volatile component remains in the adhesive film, the film itself produces foams at curing process, producing the voids inside the film, causing a decreased reliability. By reducing the amount of the residual volatile component to 3.0% or less, the foaming at the curing process can be reduced.

The adhesive film of the present invention can be prepared in a film form, by dissolving or suspending the adhesive composition of the present invention in the solvent to give a varnish, coating the same onto a support and by heating to evaporate the solvent. The heating conditions in this process are preferably, for example, from 80 to 250° C. and from 10 minutes to 20 hours.

As the support, s plastic film such as polytetrafluoroethylene, polyethylenetelephthalate, polyethylene, polypropylene, polymethylpentene, polyimide, etc. can be used, and these supports can be used after release-treating their surfaces. The support can be peeled off upon use so that the adhesive layer is used alone, or it can be removed later, so that the support can be used together with an adhesive film.

As to the above-mentioned solvent for varnish, it is not specifically limited, but when the volatile property is considered, a solvent with a relatively low boiling point can be preferably used, for example, methanol, ethanol, 2-methoxyethanol, 2-butoxyethanol, methyl ethyl ketone, acetone, methyl isobutyl ketone, 2-ethoxyethanol, toluene, xylene, etc. Further, for the purpose of improving the coating properties, a solvent with a relatively high boiling point such as dimethylacetamide, dimethylformamide, N-methylpyrrolidone, cyclohexanone, etc. may be added.

In preparation of the varnish in which the inorganic fillers are added to the adhesive composition of the present invention, in view of dispersibility of the inorganic filler, it is preferred to use a mixer, a three-roll mill, a ball mill, a beads mill, etc., or these can be used in combination. In the present invention, when the filler is added to the adhesive composition, it is preferred to employ a method in which an epoxy resin, a curing agent and a filler are mixed with one another, and then, a polymer compound incompatible with the epoxy resin is mixed into the resultant mixture to produce an adhesive composition. By employing the above production method, a film of the epoxy resin is formed at the interface of the filler. Therefore, after the rubber and the epoxy resin undergo phase separation and curing, a larger amount of the filler remains in the epoxy resin phase, so that the effect of reinforcing adhesion of the interface between the epoxy resin and the filler is increased, thus improving the heat resistance of the resultant cured product. After a varnish is prepared, the varnish may be deaerated by vacuum deaeration, etc. to remove foams in the varnish.

As a method for coating a varnish to a support film, a known method can be used, and examples include a knife coating method, a roll coating method, a spray coating method, a gravure coating method, a bar coating method, a curtain coating method, etc.

With respect to the thickness of the adhesive layer, there is no particular limitation, but the thickness is preferably 3 to 300 μm, more preferably 10 to 250 μm, further preferably 25 to 200 μm. When the thickness is in this range, the adhesive film can fully exhibit the stress relaxation effect, and at the same time, it is advantageous from an economical point of view.

Further, for obtaining a desired thickness of the adhesive layer in the adhesive film of the present invention, two or more films can be attached to one another. In this case, it is required to set conditions for attaching films so that no peeling occurs between the adhesive layers.

The adhesive film in which the adhesive composition of the present invention are laminated, being separated as the first adhesive layer and the second adhesive layer can be prepared by forming the first and the second adhesive layer on a support respectively, and by press-bonding and heating these adhesive layers of a film form. For example, it can be prepared by laminating the first and the second adhesive layers, followed by attaching themselves by a hot roll laminator. In this case, a film-shaped adhesive layer can be used alone after peeling off a film-shaped support, or it may be used without peeling off the film-shaped support. In the latter case, the film-shaped support may be used as a cover film.

Further, an adhesive film in which a curing degree is higher in the second adhesive layer than the first adhesive layer can also be prepared by coating a varnish comprising a composition of the second adhesive layer on a film-shaped support, heating to remove a solvent, coating a varnish comprising a composition of the first adhesive layer onto the second adhesive layer, and heating again.

The thickness of the first and the second adhesive layers are preferably 10 to 250 μm, respectively, but it is not limited to this. In addition, the thickness of the adhesive film comprising the laminated first adhesive layer and the second adhesive layer is thinner than that of a circuit board, filling property tends to be lowered.

The adhesive film of the present invention can be used as a core material with adhesive film, by bonding the adhesive films of the present invention on both surfaces of a core material. In this case, the first adhesive layer may be laminated on one surface of the core material, and the second adhesive layer may be laminated on the other surface. The thickness of the core material is preferably in the range of from 5 to 200 μm, but it is not limited to this range.

With respect to the material used as a core material, there is no particular limitation, but it is preferably a heat-resistant thermoplastic resin, further preferably a heat-resistant thermoplastic resin having a glass transition temperature of 260° C. or higher. When such a heat-resistant thermoplastic resin is used as a core material, a possible peeling of the adhesive film at high temperatures can be avoided, i.e., during soldering reflow. Further, heat-resistant thermoplastic resins using liquid crystalline polymers, polyamideimide, polyimide, polyetherimide, polyethersulfone, peraromatic polyester, polytetrafluoroethylene, ethylene-tetrafluoroethylene copolymers, tetrafluoroethylene-hexafluoropropylene copolymers, tetrafluoroethylene-perfluoroalkyl vinyl ether copolymers, etc. are preferably used. Further, as the heat-resistant thermoplastic resin, a porous material in a film form can be used for reducing the elastic modulus of the adhesive layer.

The adhesive layers formed on both surfaces of the core material can be firstly prepared as a varnish by dissolving or dispersing an adhesive composition in a solvent. The varnish is coated onto a heat-resistant thermoplastic film which becomes a core material, and heated to remove the solvent to form an adhesive film on the heat-resistant thermoplastic film. As the method for coating, the above-mentioned methods can be used. This step is conducted with respect to both surfaces of the heat-resistant thermoplastic film to prepare an adhesive film having adhesive layers on both surfaces of the core material. In this case, it is preferred that the surfaces of the adhesive film are protected by cover films so that the adhesive layers on both surfaces do not suffer blocking. However, when no blocking occurs, it is preferred not to use a cover film from an economical point of view.

Alternatively, a varnish prepared by dissolving or dispersing an adhesive composition in a solvent is coated onto the above-mentioned support film, and heated to remove the solvent to form an adhesive layer on the support material. The adhesive layers are laminated to both surfaces of a core material to prepare an adhesive film having adhesive layers formed on both surfaces of the core material. In this case, the support film can be used as a cover film.

The substrate for mounting semiconductor of the present invention is not limited and a lead frame having a die pad, ceramic substrates, and organic substrates may be used. As the ceramic substrates, alumina substrates and aluminum nitride substrates can be used. As the organic substrates, FR-4 substrates obtained by impregnating an epoxy resin into glass cloth, BT substrates obtained by impregnating a bismaleimide-triazine resin into glass cloth, and polyimide film substrates using a polyimide film as a base material can be used.

As the shape of wiring, any structure of single side wiring, both sides wiring, and multilayer wiring may be used, and, if desired, an electrically connected through hole or non-through hole may be formed. Further, when the wiring appears on the outer surface of the semiconductor device, it is preferred to form a protecting resin layer.

As a method for laminating an adhesive film to a supporting member, a method in which the adhesive film is cut into a desired shape, and the cut adhesive film is heat-pressed to the supporting member at a desired position is general, but the method is not limited to this.

As examples of structures of the semiconductor device of the present invention, there can be mentioned a structure such that an electrode of an semiconductor chip and a supporting member for mounting the semiconductor are connected to each other through wire bonding, and a structure such that an electrode of a semiconductor chip and a supporting member are connected to each other through inner lead bonding of tape automated bonding (TAB), etc., but the structure is not limited to these, and an effect can be obtained by any of these structures.

As the semiconductor element, general semiconductor elements such as IC, LSI, VLSI, etc. can be used.

The characteristic feature of the adhesive film of the present invention resides in that an amount of the volatile components from the adhesive layer can be reduced in heating steps such as the step of heat-pressing the adhesive film to the supporting member at a desired position and the step of connecting through wire bonding. Therefore, peeling can be reduced to an area with a diameter of less than 1 mm.

The wiring board for mounting a semiconductor of the present invention is not limited by substrate materials, such as ceramic substrates and organic substrates. The ceramic substrates and the organic substrates to be used is the same as those used for a supporting member for mounting a semiconductor, as mentioned above.

As the shape of wiring, any structures of single side wiring, both sides wiring, and multilayer wiring may be used, and, if desired, an electrically connected through hole or non-through hole may be formed.

Further, when the wiring appears on the outer surface of the semiconductor device, it is preferred to form a protecting resin layer.

For a method for connecting a semiconductor chip and outer connection part with wiring, there are a punch and pressing method and a wafer back surface attaching and press-bonding method. In the punch and pressing method, an adhesive film-pressing machine having both a film dicing function and a heat-pressing function is used. First, an adhesive film in a sheet form or a reel form is punched by a metal mold with a pre-determined size, and this is temporarily pressed onto a predetermined position of an outer connection part. Subsequently, the adhesive film is heat-pressed using a pressing means. Further, a semiconductor chip is positioned on an adhesive film, and heat-pressed to bond the outer connection part and the semiconductor chip. On the other hand, in the wafer back surface attaching and press-bonding method, an adhesive film is attached by heat-pressing laminate method, etc. on a back surface of a wafer on which a semiconductor chip is formed, followed by laminating a dicing tape thereon, and the wafer and the adhesive film were cut as a whole. Subsequently, the dicing tape was peeled off to give a semiconductor with an adhesive film, and this is heat-pressed onto an outer connection part with wiring or another semiconductor chip.

In any method for press-bonding, it is required to use a pressure of 0.5 MPa or less, to prevent the chip from being broken. Laminating temperature and press-bonding temperature and time are selected under a condition that the bonding can be carried out without forming voids and excessive oozing at a bonding interface. The laminating temperature is preferably around at 100° C., the press-bonding temperature is preferably from 100 to 200° C., and especially preferably from 140 to 180° C., considering heat resistance of the outer connection part. Further, the press-bonding time is preferably from 0.5 to 5 seconds considering productivity.

Figure 2:
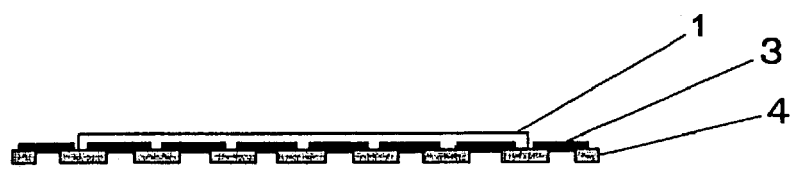
FIG. 2 shows an outer connection part for mounting a semiconductor chip using an adhesive film of the present invention wherein 1 represents an adhesive film, 3 represents a wiring and 4 represents an outer connection part.
Figure 3:
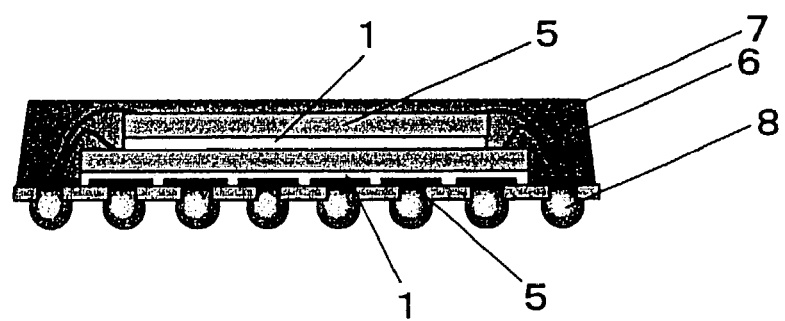
FIG. 3 shows a semiconductor device in which a semiconductor chip is bonded on an outer connection part for mounting a semiconductor chip with the adhesive film of the present invention, wherein 1 represents an adhesive film, 5 represents a semiconductor chip, 6 represents a bonding wire, 7 represents a encapsulating resin, and 8 represents an outer connection terminal (solder ball), respectively.

The adhesive film of the present invention may be an independent adhesive film 1 as shown in FIG. 1(a), or may be an adhesive film with a core material in which the adhesive films 1 are provided on the both surfaces of the core material 2, as shown in FIG. 1(b). In addition, the outer connection part for mounting a semiconductor of the present invention has a structure as shown in FIG. 2, in which the above adhesive film 1 is bonded onto an outer connection part 4 with a wiring 3 formed thereon. Further, the semiconductor device has a structure exemplified in FIG. 3, in which an outer connection part for mounting a semiconductor shown in FIG. 2 and a semiconductor chip 5, and on top of them, another semiconductor chip 5 are bonded with the adhesive films 1, pads of the semiconductor chip and the outer connection part are connected with a bonding wire 6, the semiconductor chip 5 and the outer connection part are encapsulated by an encapsulating material 7, and solder balls are provided on the outer connection termini 8.

EXAMPLES

Hereinbelow, the present invention will be described in more detail with reference to the following Examples, which should not be construed as limiting the scope of the present invention.

Example 1

Sample 1

Methyl ethyl ketone was added to an adhesive composition comprising 45 parts by weight of bisphenol A type epoxy resin (epoxy equivalent 175, manufactured by Tohto Kasei Co., Ltd., trade name: YD-8125) and 15 parts by weight of a cresol novolak type epoxy resin: (epoxy equivalent 210, manufactured by Tohto Kasei Co., Ltd., trade name: YDCN-703) as an epoxy resin, 40 parts by weight of a phenol novolak resin (manufactured by Dainippon Ink & Chemicals, Inc., trade name: Plyofen LF2882) as an epoxy resin curing agent, 66 parts by weight of an epoxy group-containing acrylic rubber as an epoxy group-containing acrylic type copolymer (molecular weight: 1,000,000, grycidyl group-containing repeating unit 3% by weight, Tg: −7° C., manufactured by Teikoku Chemical Industries Co., Ltd.; trade name: HTR-860P-3DR(C)) as a polymer, and, as a curing accelerator, 0.5 part by weight of an imidazole type curing accelerator (manufactured by Shikoku Kasei Kogyo Co., trade name: Curezol 2PZ-CN), and they were mixed by stirring, and then vacuum-deaerated. The resultant adhesive varnish was coated on a release-treated polyethylene-terephthalate film having a thickness of 75 μm, and heated for drying at 90° C. for 20 minutes, and subsequently at 120° C. for 5 minutes to form a coating film having a thickness of 60 μm, thus preparing an adhesive film E1.

A cured product obtained by heat-curing this adhesive film at 170° C. for 1 hour has a storage elastic modulus of 600 MPa at 25° C., and 5 MPa at 260° C. An amount of the residual solvent was 1.4% by weight, and the ratio A/B was 1.52 in which A represents the total weight of the epoxy resin and its curing agent and B represents an amount of the polymer compound.

Sample 2

An adhesive film E2 was prepared in the same manner as in Sample 1, except for using 42 parts by weight of the epoxy group-containing acrylic rubber used in Sample 1. The ratio A/B was 2.38.

Sample 3

An adhesive film E3 was prepared in the same manner as in Sample 1, except for using 24 parts by weight of the epoxy group-containing acrylic rubber used in Sample 1. The ratio A/B was 4.17.

Sample 4

Methyl ethyl ketone was added to an adhesive composition comprising 55 parts by weight of polygrycidyl ether of brominated phenol novolak resin (epoxy equivalent 285, manufactured by Nihon Kayaku Co., Ltd., trade name: BREN-S) as an epoxy resin, 40.8 parts by weight of a brominated phenol resin (manufactured by Teijin Kasei Co., Ltd., trade name: Fireguard FG200) and 5.9 parts by weight of a phenol novolak resin (manufactured by Dainippon Ink & Chemicals, Inc., trade name: Plyofen LF2882) as an epoxy resin curing agent, 68 parts by weight of an epoxy group-containing acrylic rubber, as an epoxy group-containing acrylic type polymer (molecular weight: 1,000,000, grycidyl group-containing repeating unit 3% by weight, Tg: −7° C., manufactured by Teikoku Chemical Industries Co., Ltd.; trade name: HTR-860P-3DR(C)) as a polymer, 0.5 part by weight of an imidazole type curing accelerator (manufactured by Shikoku Kasei Kogyo Co., trade name: Curezol 2PZ-CN) as a curing accelerator, and 21 parts by weight of diantimony trioxide (manufactured by Nihon Seiko Co., trade name: PATOX-U) as a filler, and they were mixed by stirring, and then vacuum-deaerated. The resultant adhesive varnish was coated on a release-treated polyethylene terephthalate film having a thickness of 75 μm, and heated for drying at 90° C. for 20 minutes, and subsequently at 120° C. for 5 minutes to form a coating film having a thickness of 60 μm, thus preparing an adhesive film E4.

A cured product obtained by heat-curing this adhesive film at 170° C. for 1 hour has a storage elastic modulus of 1000 MPa at 25° C., and 5 MPa at 260° C. An amount of the residual solvent was 1.2% by weight, and the ratio A/B was 1.50.

Sample 5

An adhesive film E5 was prepared in the same manner as in Sample 4, except for using 44 parts by weight of the epoxy group-containing acrylic rubber used in Sample 4. The ratio A/B was 2.31.

Sample 6

An adhesive film E6 was prepared in the same manner as in Sample 4, except for using 26 parts by weight of the epoxy group-containing acrylic rubber used in Sample 4. The ratio A/B was 3.91.

Comparative Sample 1

An adhesive film C1 was prepared in the same manner as in Sample 1, except for using 110 parts by weight of the epoxy group-containing acrylic rubber used in Sample 1. The ratio A/B was 0.91.

Comparative Sample 2

An adhesive film C2 was prepared in the same manner as in Sample 1, except for using 5 parts by weight of the epoxy group-containing acrylic rubber used in Sample 1. The ratio A/B was 20.00.

Using the obtained adhesive films E1 to E6 and C1 to C2, a semiconductor chip and a wiring board using a polyimide film with 25 μm thickness as a substrate were heat-pressed for 5 seconds under the conditions for temperature and pressure shown in Table 1, and subsequently, it was heated at 170° C. for 1 hour for curing to prepare a semiconductor device sample with an adhesive film (solder balls are formed on single piece). And the sample was tested with respect to filling property, oozing property at via-holes and terminals, heat resistance, moisture resistance, foaming, and a shelf life for evaluating storing property.

The filling property was evaluated by observing a filling of the adhesive into a circuit by an optical microscope. Those without a void between the adhesive and the circuit provided on the wiring board were evaluated as "o", and those with voids were evaluated as "X". Oozing of the resin from the through-holes or terminals are observed by an optical microscope and those without oozing were evaluated as "o", and those with oozing were evaluated as "X".

The heat resistance was evaluated by using reflow resistance test and a temperature cycle test. The evaluation of the reflow resistance was made as follows. A sample was placed in an IR reflow furnace in which the temperature was adjusted so that the maximum temperature of the sample surface became 240° C. and this temperature was kept for 20 seconds, and then cooled by allowing the sample to stand at room temperature. The sequence of the above treatments was repeated two times, and then, the resultant sample was observed by direct observation and through an ultrasonic microscope with respect to generation of cracks. A sample in which no crack was observed was evaluated as "o", and a sample in which a crack was observed was evaluated as "X". The evaluation of the temperature cycle resistance was made as follows. A sample was allowed to stand in an atmosphere at −55° C. for 30 minutes and then stand in an atmosphere at 125° C. for 30 minutes. The sequence of the above treatments was repeated 1,000 cycles, and then, the resultant sample was observed by an ultrasonic microscope whether or not peeling or crack is generated. A sample in which no crack, etc. was observed was evaluated as "o", and a sample in which a crack, etc. was observed was evaluated as "X".

Evaluation for moisture resistance was done by treating a sample at a temperature of 121° C., under a humidity of 100%, and in an atmosphere of $2.03 \times 10^5$ Pa (pressure cooker test, PCT treatment) for 72 hours, and by observing the sample whether a peeling exists. A sample in which no peeling was observed in the adhesive member evaluated as "o", and a sample in which peeling was observed in the adhesive member was evaluated as "X".

Existence of foaming was confirmed by observing the sample using an ultrasonic microscope, with respect to generation of foams in the semiconductor device sample. A sample in which no foam was observed in the adhesive film was evaluated as "o", and a sample in which foam was observed in the adhesive film was evaluated as "X". Evaluation of the shelf life was done as follows. The above mentioned semiconductor device sample was prepared using the adhesive film after having been stored at 25° C. for 3 months. And then, a filling property was confirmed and a sample in which no void was observed between the adhesive film and the circuit provided on the wiring board was evaluated as "o", and a sample in which voids were observed was evaluuated as "X".

The results are shown in Table 1.

TABLE 1

| Evaluations | Samples | | | | | | Comparative samples | |
|---|---|---|---|---|---|---|---|---|
| | 1 | 2 | 3 | 4 | 5 | 6 | 1 | 2 |
| Load for bonding kPa | 65 | 65 | 65 | 98 | 65 | 65 | 65 | 65 |
| Temperature for bonding ° C. | 160 | 160 | 160 | 180 | 180 | 160 | 160 | 160 |
| Filling property | ○ | ○ | ○ | ○ | ○ | ○ | X | ○ |
| Oozing at via-hole, terminal | ○ | ○ | ○ | ○ | ○ | ○ | ○ | X |
| Heat resistance | | | | | | | | |
| Reflow resistance | ○ | ○ | ○ | ○ | ○ | ○ | X | X |
| Temperature cycle resistance | ○ | ○ | ○ | ○ | ○ | ○ | X | X |
| Moisture resistance | ○ | ○ | ○ | ○ | ○ | ○ | X | X |
| Foaming | ○ | ○ | ○ | ○ | ○ | ○ | ○ | X |
| Shelf life | ○ | ○ | ○ | ○ | ○ | ○ | X | ○ |

From Table 1, it was shown that the adhesive films E1 to E6 of the present invention in which a ratio of A/B exceeds 1 and is 10 or less, where A is the total weight of the epoxy resin and the curing agent and B is a weight of the polymer compound are excellent in every characteristic including filling property, oozing property at via-holes and terminals, heat resistance, moisture resistance foaming property and shelf life. On the other hand, the adhesive film C1 whose A/B ratio is 1 or less showed insufficient results in filling property, heat resistance, moisture resistance and shelf life. Also, the adhesive film C2 whose A/B ratio largely exceeds 10 also showed insufficient results in oozing property at via-holes and terminals, heat resistance, moisture resistance and foaming property.

Example 2

Sample 7

(1) Preparation of the First Adhesive Layer

Methyl ethyl ketone was added to an adhesive composition comprising 45 parts by weight of bisphenol A type epoxy resin (epoxy equivalent 175, manufactured by Tohto Kasei Co., Ltd., trade name: YD-8125) and 15 parts by weight of a cresol novolak epoxy resin (epoxy equivalent 210, manufactured by Tohto Kasei Co., Ltd., trade name: YDCN-703) as an epoxy resin, 40 parts by weight of a phenol novolak resin (manufactured by Dainippon Ink & Chemicals, Inc., trade name: Plyofen LF2882) as an epoxy resin curing agent, 66 parts by weight of an epoxy group-containing acrylic rubber as an epoxy group-containing acrylic type polymer (molecular weight: 1,000,000, grycidyl group-containing repeating unit 3% by weight, Tg: –7° C., manufactured by Teikoku Chemical Industries Co., Ltd.; trade name: HTR-860P-3DR(C)) as a polymer, and, as a curing accelerator, 0.5 part by weight of an imidazole type curing accelerator (manufactured by Shikoku Kasei Kogyo Co., trade name: Curezol 2PZ-CN), and they were mixed by stirring, and then vacuum-deaerated. The resultant adhesive varnish was coated on a release-treated polyethylene terephthalate film having a thickness of 75 μm, and heated for drying at 90° C. for 20 minutes, and subsequently at 120° C. for 5 minutes to form a coating film having a thickness of 30 μm, thus preparing the first adhesive film. Degree of curing measured by using DSC was 5%. Storage elastic modulus of the adhesive film obtained by heat-curing this adhesive film at 170° C. for 1 hour was 600 aMPa at 25° C. and 5 MPA at 260° C.

(2) Preparation of the Second Adhesive Layer

The second adhesive layer was prepared in the same manner as in the first adhesive layer, except for heating for drying at 90° C. for 20 minutes, and subsequently at 140° C. for 5 minutes after being coated on a polywthylene terephthalate film. Degree of curing measured by using DSC was 15%.

(3) Lamination of the First and the Second Adhesive Layers

An adhesive film E7 was prepared by laminating the first and the second adhesive layers, bonding them using a hot-roll laminator under conditions of temperature of 100° C., pressure of 0.3 MPa, and velocity of 0.2 m/min. The A/B ratio was 1.52 in which A is the total weight of the epoxy resin and the curing agent, and B is a weight of the polymer compound.

Sample 8

(1) Preparation of the First Adhesive Layer

Methyl ethyl ketone was added to an adhesive composition comprising 55 parts by weight of polygrycidyl ether of brominated phenol novolak resin (epoxy equivalent 285, manufactured by Nihon Kayaku Co., Ltd., trade name: BREN-S) as an epoxy resin, 40.8 parts by weight of a brominated phenol resin (manufactured by Teijin Kasei Co., Ltd., trade name: Fireguard FG200) and 5.9 parts by weight of a phenol novolak resin (manufactured by Dainippon Ink & Chemicals, Inc., trade name: Plyofen LF2882) as an epoxy resin curing agent, 68 parts by weight of an epoxy group-containing acrylic rubber, as an epoxy group-containing acrylic type polymer (molecular weight: 1,000,000, grycidyl group-containing repeating unit 3% by weight, Tg: –7° C., manufactured by Teikoku Chemical Industries Co., Ltd.; trade name: HTR-860P-3DR(C)) as a polymer, 0.5 part by weight of an imidazole type curing accelerator (manufactured by Shikoku Kasei Kogyo Co., trade name: Curezol 2PZ-CN) as a curing accelerator, and 21 parts by weight of diantimony trioxide (manufactured by Nihon Seiko Co., trade name: PATOX-U) as a filler, and they were mixed by; stirring, and then vacuum-deaerated. The resultant adhesive varnish was coated on a release-treated polyethylene terephthalate film having a thickness of 75 μm, and heated for drying at 90° C. for 20 minutes, and subsequently at 120° C.

for 5 minutes to form a coating film having a thickness of 30 µm, thus preparing an adhesive film. A residual amount of the solvent was 1.2% by weight and storage elastic modulus of the adhesive film obtained by heat-curing this adhesive film at 170° C. for 1 hour was 1000 MPa at 25° C. and 5 MPa at 260° C.

(2) Preparation of the Second Adhesive Layer

The second adhesive layer was prepared in the same manner as in the above-mentioned first adhesive layer, except for using 68 parts by weight of the polymer compound.

(3) Lamination of the First and the Second Adhesive Layers

An adhesive film E8 was prepared by laminating the first and the second adhesive layers, bonding them using a hot-roll laminator under conditions of temperature of 100° C., pressure of 0.3 MPa, and velocity of 0.2 m/min. The A/B ratios were 2.31 in the first adhesive layer and 1.50 in the second adhesive layer.

Using the obtained adhesive films, a semiconductor chip and a wiring board using a polyimide film with 25 µm thickness as a substrate were heat-pressed for 5 seconds under the conditions for temperature and pressure shown in Table 2, and subsequently, it was heated at 170° C. for 1 hour for curing to prepare a semiconductor device sample with an adhesive film (solder balls are formed on single piece). In this preparation, the first adhesive layer was made facing to the semiconductor chip side, and the second adhesive layer was made facing to the wiring board.

The samples were tested with respect to filling property, oozing property at via-holes and terminals, heat resistance, moisture resistance, foaming, and shelf life for evaluating storing property. Tests and evaluation were carried out in the same manner as in Example 1. Results are shown in Table 2.

TABLE 2

| Evaluations | Samples | |
|---|---|---|
| | 7 | 8 |
| Load for bonding kPa | 65 | 65 |
| Temperature for bonding ° C. | 160 | 160 |
| Filling property | ◯ | ◯ |
| Oozing at via-hole, terminal | ◯ | ◯ |
| Heat resistance | | |
| Reflow resistance | ◯ | ◯ |
| Temperature cycle resistance | ◯ | ◯ |
| Moisture resistance | ◯ | ◯ |
| Foaming | ◯ | ◯ |
| Usable period | ◯ | ◯ |

From Table 2, it was shown that the samples 7 and 8 in which the adhesive films of the present invention were laminated have an excellent property.

Example 3

Sample 9

Cyclohexanone was added to an adhesive composition comprising 55 parts by weight of a cresol novolak type epoxy resin with an epoxy equivalent of 210 (manufactured by Tohto Kasei Co., Ltd., trade name: YDCN-703) as an epoxy resin, 45 parts by weight of a phenol resin with a hydroxy group equivalent of 175, moisture absorption of 1.8%, and weight loss by heating at 350° C. of 4% (manufactured by Mitsui Kagaku Kogyo Co., trade name: MILEX XLC-LL) as an epoxy resin curing agent, 1.7 parts by weight of 3-mercaptopropyltrimethoxy silane (manufactured by Nihon Yunicar Co., tradename: NUCA-189) and 3.2 parts by weight of 3-ureidopropyltriethoxy silane (manufactured by Nihon Yunicar Co. Ltd., tradename: NUCA-1160) as a silane coupling agent, and 10 parts by weight of fumed silica with an average particle diameter of 0.016 µm (manufactured by Nippon Aerosil Co., Ltd., trade name: Aerosil R972). The mixture was stirred and then, it was further kneaded using a beads mill for 90 minutes.

To the above, 70 parts by weight of acrylic rubber containing 1% by weight of grycidyl group containing repeating unit and having a weight average molecular weight of 800,000 and, as a curing accelerator, 0.5 parts by weight of 1-cyanoethyl-2-phenylimidazole (manufactured by Shikoku Kasei Kogyo Co. Ltd., trade name: Curezole 2PZ-CN) were mixed and the mixture was vacuum-deaerated. Thus prepared varnish was coated on a release-treated polyethylene terephthalate film with a thickness of 75 µm, and it was heated for drying at 140° C. for 5 minutes to give a coating film in B stage with a film thickness of 75 µm, to prepare an adhesive film E9 equipped with a support film.

Incidentally, a ratio A/B of the prepared adhesive film E9 was 1.43, where A is the total weight of the epoxy resin and the curing agent, and B is a weight of the acrylic copolymer. In addition, a weight fraction (φ) of a weight of the polymer (B) based on the total amount of the epoxy resin, the epoxy resin-curing agent, and the polymer (A+B) was 0.41.

Further, an area of a sea phase X at a section of the adhesive film was 0.34, while an area of an island phase Y was 0.66, and a ratio X/Y was 0.52. An area ratio of the sea phase was 0.60 when it was measured on a surface of the adhesive film, while it was 0.40 when measured at a position 5 µm inside from the surface. The area ratio in the center of the film (37 µm inside from the surface) was almost the same, which was 0.34.

Sample 10

An adhesive film E10 was prepared in the same manner as in Sample 9, except for using an acrylic rubber containing 2% by weight of grycidyl group-containing repeating units in place of an acrylic rubber containing 1% by weight of grycidyl group-containing repeating units. A/B was 1.43, and φ was 0.41.

Sample 11

An adhesive film E11 was prepared in the same manner as in Sample 9, except for using 64 parts by weight of a cresol novolak type epoxy resin with an epoxy equivalent of 210 (manufactured by Tohto Kasei Co., Ltd., trade name: YDCN-703) as an epoxy resin, 36 parts by weight of a phenol resin with a hydroxy group equivalent of 118, moisture absorption of 4.4%, and weight loss by heating at 350° C. of 18% (manufactured by Dainippon Ink & Chemicals, Inc., trade name; Plyofen LF2882) as an epoxy resin curing agent, and 70 parts by weight of an acrylic rubber containing 2% by weight of grycidyl group-containing repeating units. A/B ratio was 1.43, and φ was 0.41.

Sample 12

An adhesive film E12 was prepared in the same manner as in Sample 9, except for using 40 parts by weight of the acrylic rubber containing 1% by weight of grycidyl-group containing repeating unit, instead of using 70 parts by weight thereof. A/B ratio was 2.5, and φ was 0.30.

In addition, an area of a sea phase X at a section of the adhesive film was 0.35, while an area of an island phase Y was 0.65, and the ratio X/Y was 0.54. An area ratio of the sea phase was 0.60 when it was measured on a surface of the adhesive film, and it was 0.32 when measured at a position 5 μm inside from the surface. The ratio in the center of the film (37 μm inside from the surface) was almost the same, which was 0.35.

Sample 13

An adhesive film E13 was prepared in the same manner as in Sample 11, except that filler R972 used in Sample 11 was not used and kneading by a beads mill was not carried out. A/B ratio was 1.43, and φ was 0.41.

Sample 14

An adhesive film E14 was prepared in the same manner as in Sample 11, except for using silica with an average particle diameter of 0.9 μm (manufactured by Admatex Co. Ltd., trade name: SO25) in place of the fumed silica filler R972. A/B ratio was 1.43, and φ was 0.41.

Sample 15

An adhesive film E15 was prepared in the same manner as in Sample 12, except for using 28 parts by weight of a cresol novolak type epoxy resin with an epoxy equivalent of 210 (manufactured by Tohto Kasei Co., Ltd., trade name: YDCN-703) and a bisphenol A type epoxy resin with an epoxy equivalent of 173 (manufactured by Tohto Kasei Co., Ltd., trade name: YD-81257) asan epoxy resin, 26 parts by weight of a phenol resin with a hydroxy group equivalent of 175, moisture absorption of 1.8%, and weight loss by heating at 350° C. of 4% (manufactured by Mitsui Kagaku Kogyo Co., trade name: Mylex XLC-LL) and 18 parts by weight of a phenol resin with a hydroxy group equivalent of 118, moisture absorption of 4.4%, and weight loss by heating at 350° C. of 18% (manufactured by Dainippon Ink & Chemicals, Inc., trade name; Plyofen LF2882) as an epoxy resin curing agent. A/B ratio was 2.5, and φ was 0.30.

The thus prepared adhesive films E9 to E15 were measured with respect to an area of a sea phase and an island phase in a bi-phase structure and its ratio, and at the same time, evaluations were made with respect to half life in flow amount, peeling strength, tensile modulus, soldering heat resistance, PCT resistance, reflow resistance, and releasing property of the polyimide-laminated product after moisture absorption.

Measurement of the half life in flow amount was carried out by a film in B stage, and other evaluations were made with respect to a film in C stage. An adhesive film and an adhesive material comprising an adhesive film and polyimide film were heated for drying at 170° C. for 1 hour, and subsequently at 150° C. for 4 hours, to let the resin completely cured to reach C stage.

Measurements and evaluations of half life in flow amount, peeling strength, tensile modulus, reflow resistance, and releasing property of the polyimide-laminated product after moisture absorption were carried out as in the afore-mentioned manner.

Soldering heat resistance was tested by floating the samples in a solder bath kept at 240° C. or at 260° C., and a sample generating blisters in less than 40 seconds was evaluated as "X", a sample generating blisters between 40 seconds and 120 seconds was evaluated as "o", and a sample which did not generate any blisters after 120 seconds was evaluated as "⊚". Evaluations for PCT resistance were done by observing adhesive materials with respect to peeling with intervals of 100 hours, at a temperature of 121° C., humidity of 100%, and under an atmosphere of 2 atm. (pressure cocker test: PCT treatment) A sample in which no peeling was observed was evaluated as "o", and a sample in which peeling was observed was evaluated as "X".

Results for the bi-phase structure and evaluations are shown in Table 3.

TABLE 3

| Evaluations | Condition for Evaluation ° C. | Samples | | | | | | |
|---|---|---|---|---|---|---|---|---|
| | | 9 | 10 | 11 | 12 | 13 | 14 | 15 |
| Bi-phase structure | | | | | | | | |
| Area of sea phase X | | 0.34 | 0.35 | 0.27 | 0.35 | 0.33 | 0.35 | 0.28 |
| Area of island phase Y | | 0.66 | 0.65 | 0.73 | 0.65 | 0.67 | 0.65 | 0.72 |
| X/Y | | 0.52 | 0.54 | 0.37 | 0.54 | 0.49 | 0.54 | 0.39 |
| Initial value for flow amount μm | 160 | 1200 | 1100 | 1200 | 1300 | 1200 | 1200 | 900 |
| Half-life in flow amount h | 60 | 35 | 35 | 35 | 30 | 40 | 40 | 30 |
| Peeling strength N/m | 240 | 50 | 50 | 55 | 55 | 55 | 55 | 55 |
| Tensile modulus MPa | 240 | 30 | 30 | 30 | 30 | 44 | 20 | 44 |
| Soldering heat resistance | 240 | ⊚ | ⊚ | ⊚ | ⊚ | ⊚ | ⊚ | ⊚ |
| | 260 | ○ | ○ | ○ | ○ | ○ | ○ | ○ |
| PCT resistance | | ○ | ○ | ○ | ○ | ○ | ○ | ○ |
| Reflow resistance | 245 | ○ | ○ | ○ | ○ | ○ | ○ | ○ |
| Peeling of polyimide-laminate after moisture absorpotion | 260 | ○ | ○ | ○ | ○ | ○ | ○ | ○ |
| Moisture absorption of phenol resin % | | 1.8 | 1.8 | 4.4 | 1.8 | 1.8 | 1.8 | 1.8 |

Further, the prepared adhesive films were left at room temperature (25° C.) for 2 months, and evaluated with respect to peeling strength, elastic modulus, reflow resistance, PCT resistance and peeling property of the polyimide-laminate after moisture absorptioin according to the above-described methods. Results are shown in Table 4.

TABLE 4

| Evaluation | Condition for evaluation °C. | 9 | 10 | 11 | 12 | 13 | 14 | 15 |
|---|---|---|---|---|---|---|---|---|
| Peeling strength N/m | 240 | 35 | 35 | 35 | 35 | 35 | 35 | 35 |
| Tensile modulus MPa | 240 | 30 | 30 | 30 | 30 | 40 | 20 | 44 |
| Soldering heat | 240 | ◎ | ◎ | ◎ | ◎ | ◎ | ◎ | ◎ |
| resistance | 260 | ◯ | X | ◯ | X | X | X | X |
| PCT resistance |  | ◯ | ◯ | ◯ | ◯ | ◯ | ◯ | ◯ |
| Reflow resistance | 245 | ◯ | ◯ | ◯ | ◯ | ◯ | ◯ | ◯ |
| Peeling of polyimide-laminate after moisture absorpotion | 260 | ◯ | ◯ | ◯ | ◯ | ◯ | ◯ | ◯ |

The samples E9 to E15 were the adhesive films prepared by using an acrylic copolymer containing 0.5 to 2.7% by weight of the epoxy group-containing repeating units and having an average molecular weight of 100,000 or more. Here, the samples 9, 10, 13 and 14 whose A/B ratio is 1.4 and the samples 12 and 15 whose A/B ratio is 2.5 wherein A is the total weight of the epoxy resin and the curing agent, and B is a weight of the acrylic copolymer, satisfied the relationship represented by the formula $H \geq 140 \times \phi^2$, which is a relationship between a half-life (H, in hour) and $\phi$ being a weight fraction of a weight of the acrylic copolymer (B) based on a total amount of the epoxy resin, the curing agent, and the acrylic copolymer (A+B), and they showed excellent storing stabilities. Additionally, they showed excellent soldering heat resistance after absorption and PCT resistance. Moreover, even after being stored at room temperature for 2 months, these adhesive films still showed excellent soldering heat resistance at 240° C., although there were decreases in soldering heat resistance at 260° C. solely. Additionally, there were no big changes in other characteristic values showing that they have significantly high storing property.

Example 4

Sample 16

To an adhesive composition comprising 42 parts by weight of a cresol novolak type epoxy resin (manufactured by Tohto Kasei Co., Ltd., trade name: YDCN-703) as an epoxy resin, 12 parts by weight of a phenol Novolak resin (manufactured by Dainippon Ink & Chemicals, Inc., trade name; Plyofen LF2882) and 18 parts by weight of a phenol resin (manufactured by Mitsui Kagaku Kogyo Co., trade name: XLC-LL) as an epoxy resin curing agent, 44 parts by weight of epoxy group-containing acrylic polymer (manufactured by Teikoku Kagaku Sangyo Co. Ltd., trade name: HTR-860P-3) as a polymer, 0.025 parts by weight of 1-cyanoethyl-2-phenylimidazole (manufactured by Shikoku Kasei Kogyo Co. Ltd., trade name: Curezole 2PZ-CN) as a curing accelerator, 1 parts by weight of 3-mercaptopropyltrimethoxy silane and 2 parts by weight of 3-ureidopropyltrimethoxy silane as a coupling agent, and 5.3 parts by weight of fumed silica with an average particle diameter of 0.016 μm (manufactured by Nippon Aerosil Co., Ltd., trade name: Aerosil R972) as filler, was added methyl ethyl ketone as a solvent and dissolved by stirring to give a resin varnish. This varnish was coated on a polyethylene terephthalate film and heated for drying at 90° C. for 20 minutes, and subsequently at 120° C. for 5 minutes to prepare an adhesive film E16 in B stage with a thickness of about 50 μm. The A/B ratio was 1.64.

Sample 17

A resin varnish was prepared in the same manner as in Sample 16, except for changing a blending amount of the epoxy group-containing acrylic rubber (HTR-860P-3) from 44 parts by weight to 31 parts by weight. This varnish was coated on a polyethylene terephthalate film and heated for drying at 90° C. for 5 minutes and subsequently, at 140° C. for 5 minutes to give an adhesive film E17 with a thickness of about 50 μm. The A/B ratio was 2.32.

Comparative Sample 3

To an adhesive composition comprising 30 parts by weight of bisphenol A type epoxy resin (manufactured by Yuka Shell Epoxy Co., Ltd., trade name: Epicote 828) as an epoxy resin, 10 parts by weight of a cresol Novolak type epoxy resin (manufactured by Sumitomo Kagaku Kogyo Co. Ltd., trade name: ESCN 195), and 25 parts by weight of a phenol Novolak resin (manufactured by Dainippon Ink & Chemicals, Inc., trade name; Plyofen LF2882) as a curing agent, and 150 parts by weight of an epoxy group-containing acrylic rubber (manufactured by Teikoku Kagaku Sangyo CO., trade name: HTR-860P-3) as a polymer, 0.5 parts by weight of 1-cyanoethyl-2-phenylimidazole (manufactured by Shikoku Kasei Kogyo Co. Ltd., trade name: Curezole 2PZ-CN) as a curing accelerator, 2 parts by weight of each of 3-mercaptopropyltrimethoxy silane and 3-ureidopropyltrimethoxy silane as a coupling agent, was added methyl ethyl ketone as a solvent and dissolved by stirring to give a resin varnish. This varnish was coated on a polyethylene terephthalate film and heated for drying at 90° C. for 20 minutes, and subsequently at 140° C. for 5 minutes to prepare an adhesive film C3 with a thickness of about 50 μm. The A/B ratio was 0.43.

Comparative Sample 4

The resin varnish prepared in Sample 16 was coated on a polyethylene terephthalate film and heated for drying at 90° C. for 20 minutes and subsequently at 160° C. for 5 minutes to prepare an adhesive film C4 with a thickness of about 50 μm.

Comparative Sample 5

The resin varnish prepared in Sample 16 was coated on a polyethylene terephthalate film and heated for drying at 90° C. for 20 minutes and subsequently at 100° C. for 5 minutes to prepare an adhesive film C5 with a thickness of about 50 μm.

Comparative Sample 6

The resin varnish prepared in Sample 17 was coated on a polyethylene terephthalate film and heated for drying at 90° C. for 20 minutes and subsequently at100° C. for 5 minutes to prepare an adhesive film C6 with a thickness of about 50 μm.

Comparative Sample 7

The resin varnish prepared in Sample 17 was coated on a polyethylene terephthalate film and heated for drying at 90° C. for 25 minutes to prepare an adhesive film C7 with a thickness of about 50 μm.

The thus prepared adhesive films were evaluated with respect to physical properties at B stage, physical properties of cured product, press-bonding property, workability, and reliability. The results are shown in Tables 5 to 8. Measurements for physical properties of the film and heat-cured products and evaluations for press-bonding property, workability and reliability were carried out as follows.

Melting viscosity of adhesive films at B stage was measured as follows.

Eight adhesive films were laminated to prepare an adhesive film with a thickness of about 400 μm. This adhesive film was die-cut in a circle with a diameter of 11.3 mm, pressed at a predetermined temperature with a load of 2.5 kgf for 5 seconds. From the thickness before and after loading, melt viscosity was calculated by using the above-described formula (4). Tack load of the adhesive film was measured by using a tacking testing device manufactured by RHESCA Co., according to a method described in a reference column of JIS z0237-1991, at 25° C. Conditions for measurement were, 5.1 φmm for probe radius, 10 mm/sec for peeling rate, 100 gf/cm$^2$ for contact load, 1.0 second for contact time. Residual volatile volume of the adhesive film was calculated using the following formula (2) from the weights of the adhesive film before and after curing at 170° C./1 h.

The residual volatile component fraction (%)=

[(weight of the film before curing−weight of the film after curing)/weight of the film before curing]×100    (2)

Measurements for physical properties of a cured product of the adhesive film was done using a sample obtained by curing an adhesive film at B stage at 170° C. for 1 hour. A storage elastic modulus was measured using a dynamic viscoelasticity measuring machine (manufactured by Reology, DVE-V4), under conditions of sample size: length of 20 mm, width of 4 mm, thickness of 60 μm, temperature elevation rate of 5° C./min, tensile mode of 10 Hz, and automatic static loading. The coefficient for thermal expansion was measured using a thermal expansion measuring device (manufactured by Shinku Riko Co. Ltd., TM-7000), and an average coefficient for thermal expansion from −65 to 150° C. were obtained.

Laminating property and press-bonding property were measured as follows.

An adhesive film was laminated onto a back surface of a wafer with 280 μm thickness, at a temperature of 100° C., line pressure of 1 MPa, and at a rate of 0.2 m/min. In this testing, when the adhesive film was oozed from a terminal of the wafer and reached to a front surface, it was evaluated as poor in laminating property. Further, a dicing tape (manufactured by Furukawa Denko Co. Ltd., trade name: UC-334EP) was laminated at room temperature, and then, the wafer with an adhesive film was cut in a size of 7.0×9.0 mm. The dicing tape was irradiated with UV light (high pressure mercury light) at 500 mj/cm$^2$ and the dicing tape was peeled off to give a semiconductor chip with an adhesive film. This was heat-pressed onto an outer connection part with wiring under conditions as shown in Table 6, and when voids are within 10% based on the total area of the adhesive film, or when ooze from a chip terminal was within 50 μm, press-bonding property was evaluated as good.

Foaming at curing was evaluated by press-bonding an adhesive film onto an outer connection part, curing it at 170° C. in an oven for 1 hour, and by observing a section of the film with a microscope. When the fine voids were observed, it was judged as foaming exists. For the outer connection part, TAB tape with via-holes comprising a wiring layer with a wiring width of 30 μm, the narrowest line intervals of 40 μm, thickness of 20 μm, and a polyimide type film with a thickness of 50 μm was used. Conditions for press-bonding was pressing time of 1 second to 3 seconds, temperature of 140 to 180° C., pressure of 0.05 to 0.2 MPa. Peeling property from the dicing tape was evaluated by measuring a peeling strength between the adhesive film and the dicing tape after exposure at room temperature. When the peeling strength was 40 gf/cm$^2$ or more, it was judged as difficult for peeling.

Reliability was evaluated by using a semiconductor package prepared by encapsulating the above outer connection part equipped with a semiconductor chip with a resin for encapsulation (manufactured by Hitachi Kasei Kogyo Co., Ltd, trade name: CEL-9120). As factors for evaluating reliability, reflow resistance, PCT resistance, and heat cycle resistance were used. Reflow resistance was judged as follows. After subjecting a prepared semiconductor package to moisture absorption in an atmosphere of at 85° C. and 85% of humidity, a treatment was repeated for 3 times under a condition such that the highest reached temperature of the surface of the semiconductor package became 265° C. for 10 seconds, in an infrared reflow device. Subsequently, using an ultrasonic scanning damage-searching device, inside of the semiconductor package was examined, and it was evaluated with respect to peeling at a bonding interface, cracks, etc. PCT resistance was judged by treating the semiconductor package after the reflow treatment in an atmosphere at 121° C. and 100% of humidity for 200 hours, and evaluating the peeling at a bonding interface and existence of oozing of an adhesive film resin through via-holes of the outer connection part. Heat cycle resistance was judged by treating a semiconductor package in an atmosphere from −55° C. to 125° C. for 15 minutes, examining the inside of the semiconductor package with an ultrasonic scanning damage-searching device, and by evaluating peeling of a bonding interface, cracks, etc.

TABLE 5

| Samples | Melting Viscosity (Pa · s) | | | | Viscosity ratio 100° C./ 180° C. | Tack load (g/f) | Residual volatile component (%) |
| --- | --- | --- | --- | --- | --- | --- | --- |
| | 100° C. | 140° C. | 160° C. | 180° C. | | | |
| Sample 16 | 360000 | 11000 | 4200 | 1000 | 350 | 6 | 2.2 |
| Sample 17 | 33000 | 2200 | 740 | 320 | 100 | 4 | 1.8 |
| Comp. Sample 3 | 11000000 | 2800000 | 1400000 | 790000 | 14 | 10 | 0.5 |
| Comp. Sample 4 | 990000 | 360000 | 200000 | 110000 | 9 | 4 | 1.4 |

TABLE 5-continued

| | Melting Viscosity (Pa·s) | | | | Viscosity ratio 100°C./ 180°C. | Tack load (g/f) | Residual volatile component (%) |
|---|---|---|---|---|---|---|---|
| Samples | 100°C. | 140°C. | 160°C. | 180°C. | | | |
| Comp. Sample 5 | 350000 | 6600 | 2500 | 620 | 570 | 18 | 3.5 |
| Comp. Sample 6 | 5900 | 470 | 230 | 67 | 88 | 22 | 8.6 |
| Comp. Sample 7 | 4000 | 320 | 160 | 50 | 80 | — | — |

TABLE 6

Physical properties of the adhesive film-cured product

| | Elastic Modulus (MPa) | | Average thermal coefficient of expansion |
|---|---|---|---|
| samples | 25°C. | 250°C. | −65 to 150°C. |
| Sample 16 | 800 | 12 | 125 |
| Sample 17 | 1300 | 3 | 102 |
| Comparative Sample 3 | 190 | 3 | 112 |
| Comparative Sample 4 | 800 | 12 | 125 |
| Comparative Sample 5 | 900 | 15 | 105 |
| Comparative Sample 6 | 1000 | 2 | 110 |
| Comparative Sample 7 | 800 | 3 | 108 |

TABLE 7

Workability and press-bonding property of adhesive film

| | | Press-bonding property: pressure/time (lower columns: temperature) | | | | | | Peeling property from dicing tape | Foaming at curing |
|---|---|---|---|---|---|---|---|---|---|
| | Laminating | 0.05 MPa/1s | | 0.2 MPa/1s | | 0.2 MPa/3s | | | |
| samples | property | 140°C. | 180°C. | 140°C. | 180°C. | 140°C. | 180°C. | | |
| Sample 16 | Good | X | X | X | ○ | ○ | ○ | Good | None |
| Sample 17 | Good | X | ○ | ○ | ○ | ○ | ○ | Good | None |
| Comparative Sample 3 | Good | X | X | X | X | X | X | Good | None |
| Comparative Sample 4 | Void | X | X | X | X | X | X | Good | None |
| Comparative Sample 5 | Good | X | ○ | X | ○ | — | — | Good | Foam |
| Comparative Sample 6 | Oozing | X | ○ | ○ | ○ | — | — | Peeling impossible | Foam |
| Comparative Sample 7 | Oozing | X | ○ | ○ | Δ | — | — | — | — |

○: good press-bonding property,
Δ: excessive oozing,
X: poor press-bonding property (with voids)

TABLE 8

Reliability of semiconductor package prepared by adhesive film

| | Reflow resistance[1] | | PcT resistance[2] | Heat cycle resistance[1] |
|---|---|---|---|---|
| | 245°C. | 260°C. | | |
| Sample 16 | Good | Good | Good | Good |
| Sample 17 | Good | Good | Good | Good |
| Comparative Sample 3 | Good | Good | Good | Good |

TABLE 8-continued

Reliability of semiconductor package prepared by adhesive film

| | Reflow resistance[1] | | PcT resistance[2] | Heat cycle resistance[1] |
|---|---|---|---|---|
| | 245° C. | 260° C. | | |
| Comparative Sample 4 | Good | Good | Good | Good |
| Comparative Sample 5 | Adhesive film Cohesive failure | Adhesive film Cohesive failure | — | — |
| Comparative Sample 6 | Adhesive film Cohesive failure | Adhesive film Cohesive failure | — | — |

[1]Good: No peeling at interface, no cracks, etc.
[2]Good: No oozing of the adhesive film resin from via-holes of outer connection part From Tables 5 to 8, it was shown that the adhesive film of the present invention has a melting viscosity at 100° C. or less of 5×10 to 1×10$^5$ Pa·s, tack load of 2 to 20 gf, residual volatile component of 3% or less, and it can connect a semiconductor chip and an outer connection part for mounting the same with a pressure of as small as 0.01 to 0.5 MPa, without leaving voids at a bonding interface, and without causing an ooze at the terminals. Therefore, the present invention can provide an adhesive film excellent in press-bonding property, workability and reliability.

INDUSTRIAL APPLICABILITY

The adhesive composition of the present invention whose A/B ratio exceeds 1 and is 10 or less, wherein A is the total amount of an epoxy resin and a curing agent and B is a weight of a polymer compound, has an excellent moisture resistance, reflow resistance and heat resistance, as mentioned above. Further, by using a phenol resin with a low moisture absorbing property represented by the general formula (I) as a curing agent, it is possible to improve moisture absorption resistance. And by using an acrylic copolymer as a polymer compound, an adhesive agent excellent in reflow resistance can be obtained by forming cross-linking structures. Further, since this acrylic copolymer is immiscible with the epoxy resin, the resin is separated into two phases after curing, to give an excellent adhesive which can effectively exhibit a reflow resistance of the acrylic resin and the heat resistance of the epoxy resin. Still further, by optionally adding inorganic fillers, an adhesive can be obtained with a high elastic modulus at high temperature, high peeling strength at a high temperature, with a reflow crack preventing effect and excellent reflow resistance.

Further, by using the adhesive composition of the present invention, an adhesive film can be prepared, which is excellent in storing property in addition to the above-mentioned properties. Especially, the adhesive of reactive rubber type with a short life is improved, whereby the adhesive film can be kept at room temperature for 2 months and more, which conventionally has to be used within a short time after purchase. This effect of largely moderating the limitation for productivity of the adhesive film is significant.

In addition, the adhesive film prepared from the adhesive composition of the present invention can connect a semiconductor chip and an outer connection part with wiring for mounting the same with a small press-bonding pressure, thereby it is excellent in press-bonding property, workability and reliability, Further, the wiring board for mounting a semiconductor and the semiconductor device using the adhesive film of the present invention has heat resistance and moisture resistance required for mounting a semiconductor chip on a board for mounting a semiconductor with largely different thermal coefficients of expansion.

The invention claimed is:

1. An adhesive film for bonding a semiconductor chip and a substrate for mounting a semiconductor chip or for bonding semiconductor chips themselves, wherein said adhesive film comprises an adhesive composition including:
   (a) an epoxy resin containing a solid epoxy resin having a softening point of 50° C. or more as measured by a ring and ball method, included in an amount of 20% by weight or more based on the total weight of the epoxy resin,
   (b) a curing agent and
   (c) a polymer compound with a weight average molecular weight of 100,000 or more,
   wherein a ratio of A/B exceeds 1 and is 10 or less, where A is the total weight of (a) the epoxy resin and (b) the curing agent and B is a weight of (c) the polymer compound,
   wherein a melt viscosity of the adhesive film at a press-bonding temperature is in a range of 5×10 to 1×10$^5$ Pa·s,
   wherein a tack load measured according to Probe tack test at 25° C. is in a range of 2 to 20 gf and
   wherein the polymer compound comprises a sea phase and the epoxy resin and the curing agent comprise an island phase in the adhesive composition.

2. The adhesive film according to claim 1, wherein a half-life (H, in hour) of a resin flow amount after heat-treatment at 60° C. and a weight fraction (φ) of a weight of (c) the polymer compound based on the total weight of (a) the epoxy resin, (b) the curing agent and (c) the polymer compound satisfies a relation represented by $H \geq 140 \times \phi^2$.

3. The adhesive film according to claim 1, wherein at least one of (a) the epoxy resin and (b) the curing agent is a compound comprising a bromine atom.

4. The adhesive film according to claim 1, wherein (b) the curing agent is a phenolic resin with a hydroxyl group equivalent of 150 g/eq or more.

5. The adhesive film according to claim 4, wherein (b) the curing agent is a phenolic resin represented by the following general formula (I):

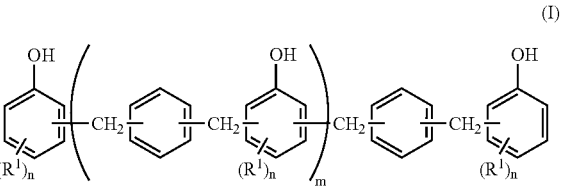

(wherein R$^1$ may be the same or different, each representing a hydrogen atom, a halogen atom, a C$_1$–C$_{10}$ linear or branched alkyl group, a cyclic alkyl group, an aralkyl group, an alkenyl group, a hydroxy group, or an aryl group, n is an integer of 1 to 3, and m is an integer of 0 to 50).

6. The adhesive film according to claim 1, wherein (c) the polymer compound is an epoxy group—containing acrylic copolymer which is immiscible with an epoxy resin.

7. The adhesive film according to claim 6, wherein the epoxy group-containing acrylic copolymer contains glycidylacrylate or glycidyl methacrylate repeating unit in an amount of 0.5 to 6.0% by weight.

8. The adhesive film according to claim 6, wherein the epoxy group-containing acrylic copolymer has a glass transition temperature of −50° C. to 0° C.

9. The adhesive film according to claim 1, comprising 0.1 to 5 parts by weight of the curing accelerator, based on 100 parts by weight of the total amount of (a) the epoxy resin and (b) the curing agent.

10. The adhesive film according to claim 1, further comprising (d) a filler.

11. The adhesive film according to claim 10, wherein (d) the filler has an average particle diameter of 0.005 μm to 0.1 μm.

12. The adhesive film according to claim 10, wherein (d) the filler is an inorganic filler and the inorganic filler is contained by 1 to 50 parts by volume based on 100 parts of a volume of the resin.

13. The adhesive film according to claim 10, wherein (d) the inorganic filler is a filler whose surface is coated with an organic material.

14. The adhesive film according to claim 10, wherein (d) the filler has a contact angle with water of 0 to 100 degrees.

15. The adhesive film according to claim 1, wherein the adhesive composition has a tensile modulus at 240° C. of to 10 MPa.

16. A method for producing the adhesive film according to claim 1, which comprises;
(i) mixing and kneading the adhesive composition in the presence or the absence of a solvent to prepare a varnish;
(ii) coating the obtained varnish on a support film; and
(iii) drying the support film coated with the varnish to obtain an adhesive film at B stage.

17. The adhesive film according to claim 1, wherein a melt viscosity thereof at 100° C. or less is $1\times10^4$ Pa·s or more.

18. The adhesive film according to claim 17, wherein a ratio of melt viscosity at 100° C. or less and a melt viscosity at a press-bonding temperature is in a range of $1\times10$ to $1\times10^3$.

19. The adhesive film according to claim 1, which has a peeling strength at 240° C. of 50 N/m or more.

20. The adhesive film according to claim 1, wherein an average coefficient of thermal expansion thereof at −65 to 150° C. is 50 to 150 ppm/° C.

21. The adhesive film according to claim 1, wherein a storage elastic modulus thereof is 20 to 2000 MPa at 25° C. and 3 to 50 MPa at 260° C.

22. The adhesive film according to claim 1, wherein the residual volatile component is 3.0% or less.

23. The adhesive film according to claim 1, wherein the laminated and cured product thereof does not suffer peeling with a diameter of 2 mm or more during a heat treatment at 260° C. after moisture absorption treatment.

24. The adhesive film according to claim 1, wherein thickness of a layer of the adhesive film is 10 to 200μm.

25. An adhesive film which comprises two laminated layers of the adhesive film according to claim 1, wherein the first adhesive film layer has a curing degree according to differential scanning calorimeter analysis (DSC) In a range of 0 to 40%, and the second adhesive layer has a content of the polymer compounds which is greater than that of the first film by 10 parts by weight or more, or has a curing degree by DSC which is greater than that of the first layer by 5% or more.

26. A wiring board for mounting a semiconductor with an adhesive film, wherein the adhesive film according to claim 25 is provided on a semiconductor mounting surface of the wiring board in a way such that the second adhesive film layer is in contact with the wiring board.

27. A semiconductor chip with an adhesive film, wherein the adhesive film according to claim 25 is provided on a semiconductor chip in a way such that the first adhesive film layer is in contact with the semiconductor chip.

28. A semiconductor device, which comprises a structure in which a semiconductor chip and a circuit board or a circuit film are bonded by the adhesive film according to claim 25, wherein the first adhesive film layer is in contact with the semiconductor chip and the second adhesive film layer is in contact with the circuit board or the circuit film.

29. An adhesive film with a support, wherein adhesive films according to claim 1 are laminated, directly or intermediated by another layer, on one surface or on both surfaces of a support film.

30. The adhesive film with a support according to claim 29, which further comprises a layer for protecting the adhesive film on one surface or on both surfaces thereof.

31. The adhesive film with a support according to claim 29, wherein the support film is a heat resistant film.

32. The adhesive film with a support according to claim 29, wherein the support film has a glass transition temperature of 200° C. or more.

33. A wiring board for mounting a semiconductor chip with an adhesive film, wherein the adhesive film of claim 1 is provided on a semiconductor chip mounting surface of a wiring board.

34. A semiconductor chip with an adhesive film, wherein the adhesive film of claim 1 is provided on a semiconductor chip.

35. A method for producing a semiconductor device which comprises:
(1) a step of laminating the adhesive film of claim 1 on an opposite surface of a wafer on which a semiconductor chip is formed;
(2) a step of laminating a dicing tape on the laminated adhesive film;
(3) a step of cutting the laminated wafer and the adhesive film as a whole;
(4) a step of peeling the dicing tape to give a semiconductor chip with an adhesive film; and
(5) a step of heat-pressing to bond the semiconductor chip with the adhesive film onto an outer connection part with wiring or another semiconductor chip.

36. A semiconductor device wherein a semiconductor chip is mounted on a wiring board for mounting a semiconductor intermediated by the adhesive film of claim 1.

37. A semiconductor device having a structure in which a plurality of semiconductor chips are laminated on one surface or both surfaces of a wiring board for mounting a semiconductor, wherein the adhesive film of claim 1 is used for at least one bonding between the wiring board for mounting a semiconductor and a semiconductor chip of the plurality of semiconductor chips, or bonding between the semiconductor chips themselves.

38. The semiconductor device according to claim 37, wherein the wiring board for mounting a semiconductor is an organic board.

39. The semiconductor device according to claim 36, which does not suffer peeling with a diameter of 1mm or more between en adhesive layer and a semiconductor chip, during a process of passing through a reflow furnace kept at 260° C. after moisture absorption treatment at a temperature of 85° C., at a relative humidity of 85% for 168 hours.

40. The adhesive film according to claim 1, wherein the epoxy resin is incompatible with the polymer compound.

41. The adhesive film according to claim 1, which forms a cured product having an islands-in-sea structure.

42. The adhesive film according to claim 41, wherein in a section of the cured product an area ratio of the sea phase is larger on a surface than at a position 5 μm from the surface.

* * * * *